(12) United States Patent
Koizumi et al.

(10) Patent No.: US 10,868,982 B2
(45) Date of Patent: Dec. 15, 2020

(54) PHOTOELECTRIC CONVERSION APPARATUS, PHOTOELECTRIC CONVERSION SYSTEM, MOVING OBJECT

(71) Applicant: CANON KABUSHIKI KAISHA, Tokyo (JP)

(72) Inventors: Satoshi Koizumi, Kawasaki (JP); Masahiro Kobayashi, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/524,850

(22) Filed: Jul. 29, 2019

(65) Prior Publication Data

US 2020/0045251 A1 Feb. 6, 2020

(30) Foreign Application Priority Data

Aug. 3, 2018 (JP) .................. 2018-146715

(51) Int. Cl.
| | |
|---|---|
| *H04N 5/351* | (2011.01) |
| *H04N 5/369* | (2011.01) |
| *H01L 27/146* | (2006.01) |
| *G01J 1/42* | (2006.01) |
| *G01J 1/44* | (2006.01) |
| *G01C 3/08* | (2006.01) |

(52) U.S. Cl.
CPC ........... *H04N 5/351* (2013.01); *G01J 1/4228* (2013.01); *G01J 1/44* (2013.01); *H01L 27/1461* (2013.01); *H01L 27/14634* (2013.01); *H01L 27/14641* (2013.01); *H01L 27/14645* (2013.01); *H04N 5/379* (2018.08); *G01C 3/085* (2013.01); *G01J 2001/442* (2013.01)

(58) Field of Classification Search
None
See application file for complete search history.

(56) References Cited

U.S. PATENT DOCUMENTS 4,710,817 A * 12/1987 Ando ............... H04N 5/357
                                         348/241
6,188,473 B1 * 2/2001 Leistner ............ G01J 1/44
                                         356/213

(Continued)

FOREIGN PATENT DOCUMENTS

| JP | 2000-253320 A | 9/2000 |
|---|---|---|
| JP | 2004-193675 A | 7/2004 |

(Continued)

*Primary Examiner* — Fernando Alcon
(74) *Attorney, Agent, or Firm* — Canon U.S.A., Inc. IP Division

(57) ABSTRACT

A photoelectric conversion apparatus includes first and second photoelectric conversion elements, first and second counters, first and second reset units, an adder, and a detection unit. The first counter is configured to perform a counting operation to change a count value based on a signal input from the first photoelectric conversion element. The second counter is configured to perform a counting operation to change a count value based on a signal input from the second photoelectric conversion element. The count value of the first counter and the count value of the second counter are input to the adder. The detection unit is configured to detect an event that the count value of the first counter exceeds a threshold value.

19 Claims, 14 Drawing Sheets

(56) References Cited

U.S. PATENT DOCUMENTS

| | | |
|---|---|---|
| 2011/0249148 A1 | 10/2011 | Prescher |
| 2015/0173694 A1 | 6/2015 | Teshigawara |
| 2015/0234058 A1* | 8/2015 | Engel ..................... G01T 1/241 250/370.08 |
| 2016/0241805 A1* | 8/2016 | Nishihara ................ H04N 5/32 |
| 2016/0305818 A1* | 10/2016 | Ichikawa ................. G01T 1/16 |

FOREIGN PATENT DOCUMENTS

| | | |
|---|---|---|
| JP | 2014-083361 A | 5/2014 |
| JP | 2018-000422 A | 1/2018 |

\* cited by examiner

PHOTOELECTRIC CONVERSION APPARATUS, PHOTOELECTRIC CONVERSION SYSTEM, MOVING OBJECT

BACKGROUND

Field

One disclosed aspect of the embodiments relates to a photoelectric conversion apparatus, a photoelectric conversion system, and a moving object.

Description of the Related Art

A conventional photoelectric conversion apparatus using photon counting has been known.

For example, Japanese Patent Application Laid-Open No. 2014-083361 discusses an photoelectric conversion apparatus including a plurality of detection elements, a plurality of counters each connected to the corresponding detection element among the plurality of detection elements, and an adder connected to the plurality of counters as illustrated in FIG. 4 in Japanese Patent Application Laid-Open No. 2014-083361. The adder adds count values output from the counters.

Japanese Patent Application Laid-Open No. 2014-083361 is silent on processing to be performed after the count values of the counters reach an upper limit. For example, there may be a case where when the count values of two counters are to be added and output, one of the count values of the counters has reached the upper limit while the other one of the count values of the counters is less than the upper limit. When the counter after the count value reaches the upper limit receives a signal from the detection element, the count value output from the counter may remain unchanged or may return to an initial value. If such a count value is input to the adder, the adder is likely to output a signal that does not represent an accurate measurement of photons incident on the detection element. In other words, adding the count values of the counters can lead to a decrease in linearity of input/output characteristics.

While the upper limit of the count values of the counters is described as an example of a threshold value for judging whether the count value is saturated, a value less than the upper limit of the count values of the counters may be set as the threshold value for judging whether the count value is saturated. Even in this case, a decrease in linearity as described above can arise.

SUMMARY

According to an aspect of the embodiments, an photoelectric conversion apparatus includes first and second photoelectric conversion elements, first and second counters, first and second reset units, and adder, and a detection unit. The first counter is configured to perform a counting operation to change a count value based on a signal input from the first photoelectric conversion element. The second counter is configured to perform a counting operation to change a count value based on a signal input from the second photoelectric conversion element. The first reset unit is configured to reset the first photoelectric conversion element based on an amount of charge generated at the first photoelectric conversion element. The second reset unit is configured to reset the second photoelectric conversion element based on an amount of charge generated at the second photoelectric conversion element. The count value of the first counter and the count value of the second counter are input to the adder. The detection unit is configured to detect an event that the count value of the first counter exceeds a threshold value.

According to another aspect of the embodiments, a signal processing circuit includes a first counter, a second counter, an adder to which a count value of the first counter and a count value of the second counter are input, and a detection unit configured to detect an event that the count value of the first counter exceeds a threshold value. The first counter resets the count value and then continues a counting operation, after the count value of the first counter exceeds the threshold value The count value of the first counter after the resetting is input to the adder.

Further features of the disclosure will become apparent from the following description of exemplary embodiments with reference to the attached drawings.

DESCRIPTION OF THE EMBODIMENTS

A photoelectric conversion apparatus according to a first exemplary embodiment will be described below with reference to FIGS. 1 to 7. In the following, the term "planar view" may refer to: (1) a viewpoint is considered a planar view if the major axis is approximately perpendicular or parallel to the line of sight, (2) views in which the major axis of the object is (approximately) either perpendicular or parallel to the line of sight. Planar views are those that primarily show the flat planes of objects, both when looking at the 'side' of an object, where the axis of elongation is perpendicular to the line of sight, and when looking at the front or back of the object, which renders a 'foreshortened' view in which the axis of elongation is parallel to the line of sight; or (3) views in which the principal axis of the object is parallel or perpendicular to the line of sight.

Figure 1:
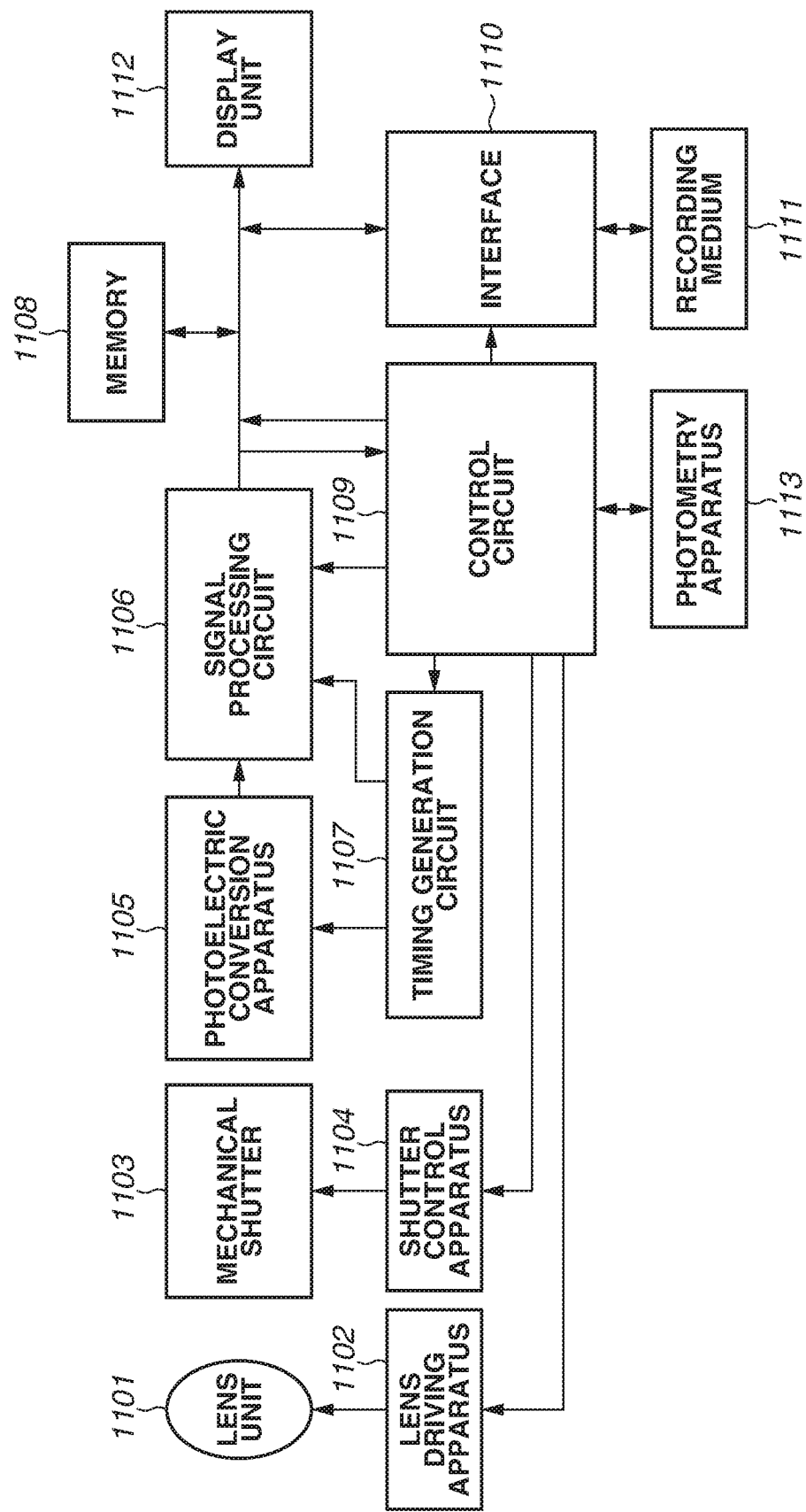
FIG. 1 is a block diagram illustrating an example of a configuration of a photoelectric conversion system including a photoelectric conversion apparatus according to a first exemplary embodiment.
Figure 2:
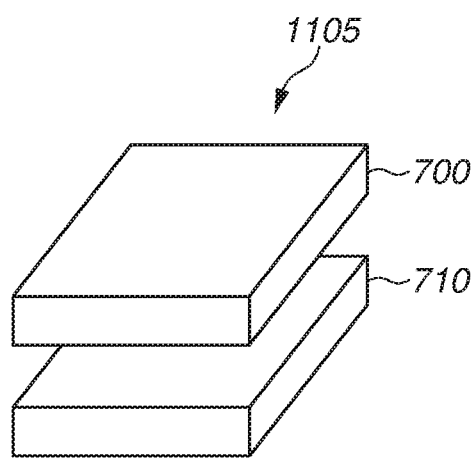
FIG. 2 is a schematic diagram illustrating the photoelectric conversion apparatus according to the first exemplary embodiment.
Figure 3:
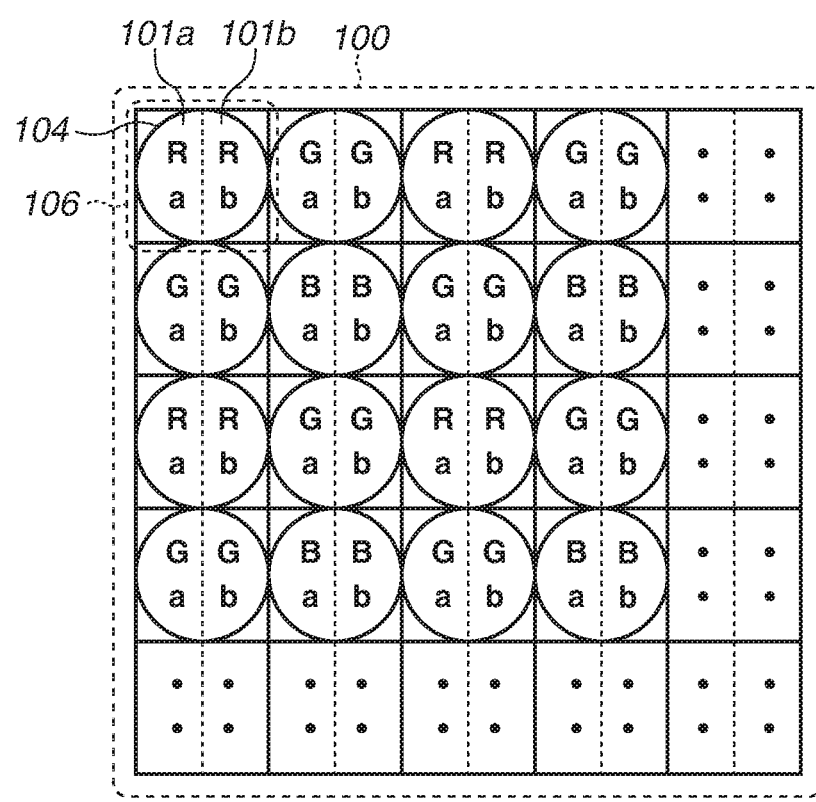
FIG. 3 is a planar view illustrating a pixel region of the photoelectric conversion apparatus according to the first exemplary embodiment.
Figure 4:
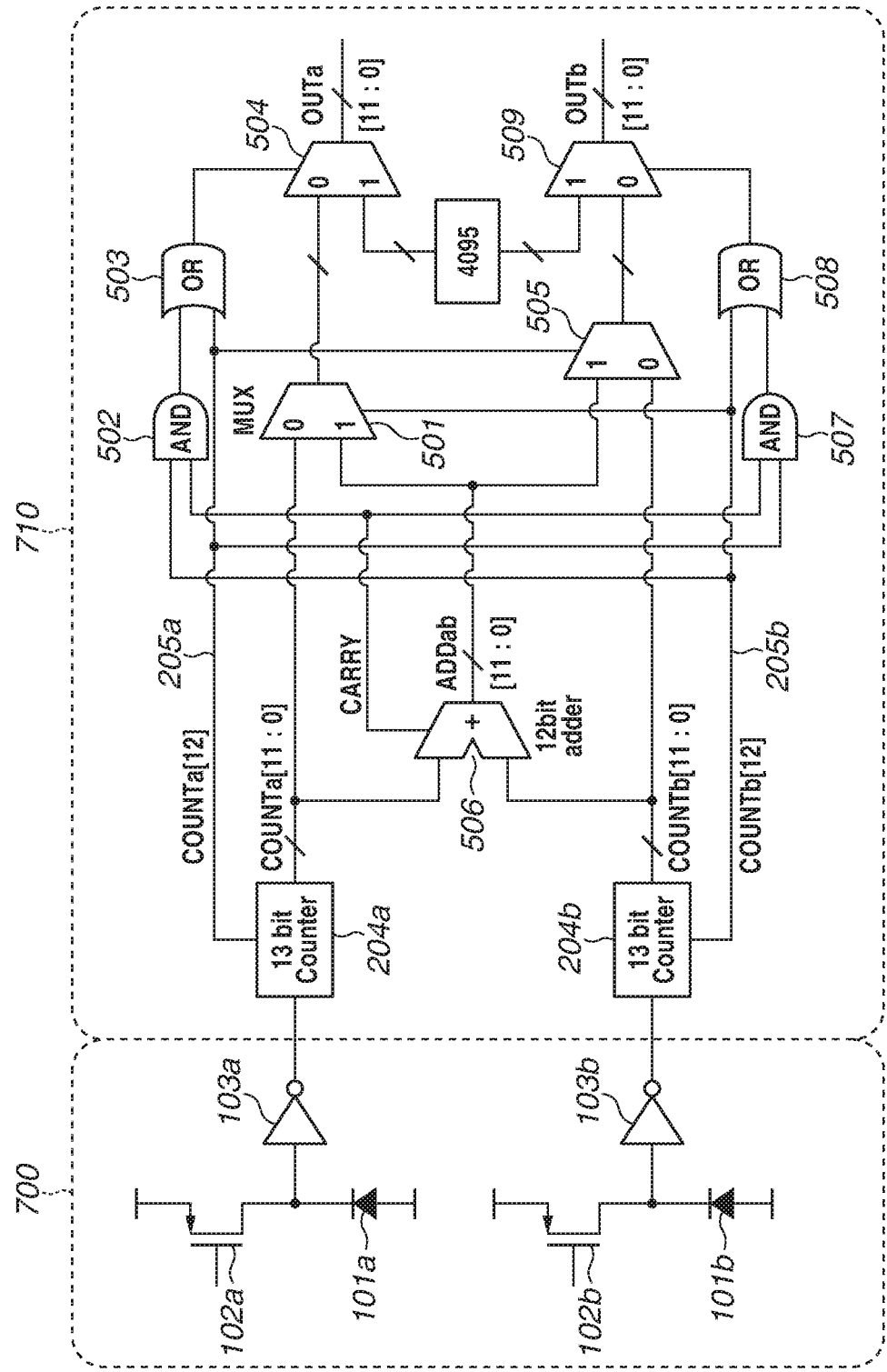
FIG. 4 is a block diagram schematically illustrating a circuit including a photoelectric conversion unit of the photoelectric conversion apparatus according to the first exemplary embodiment.
Figure 5:
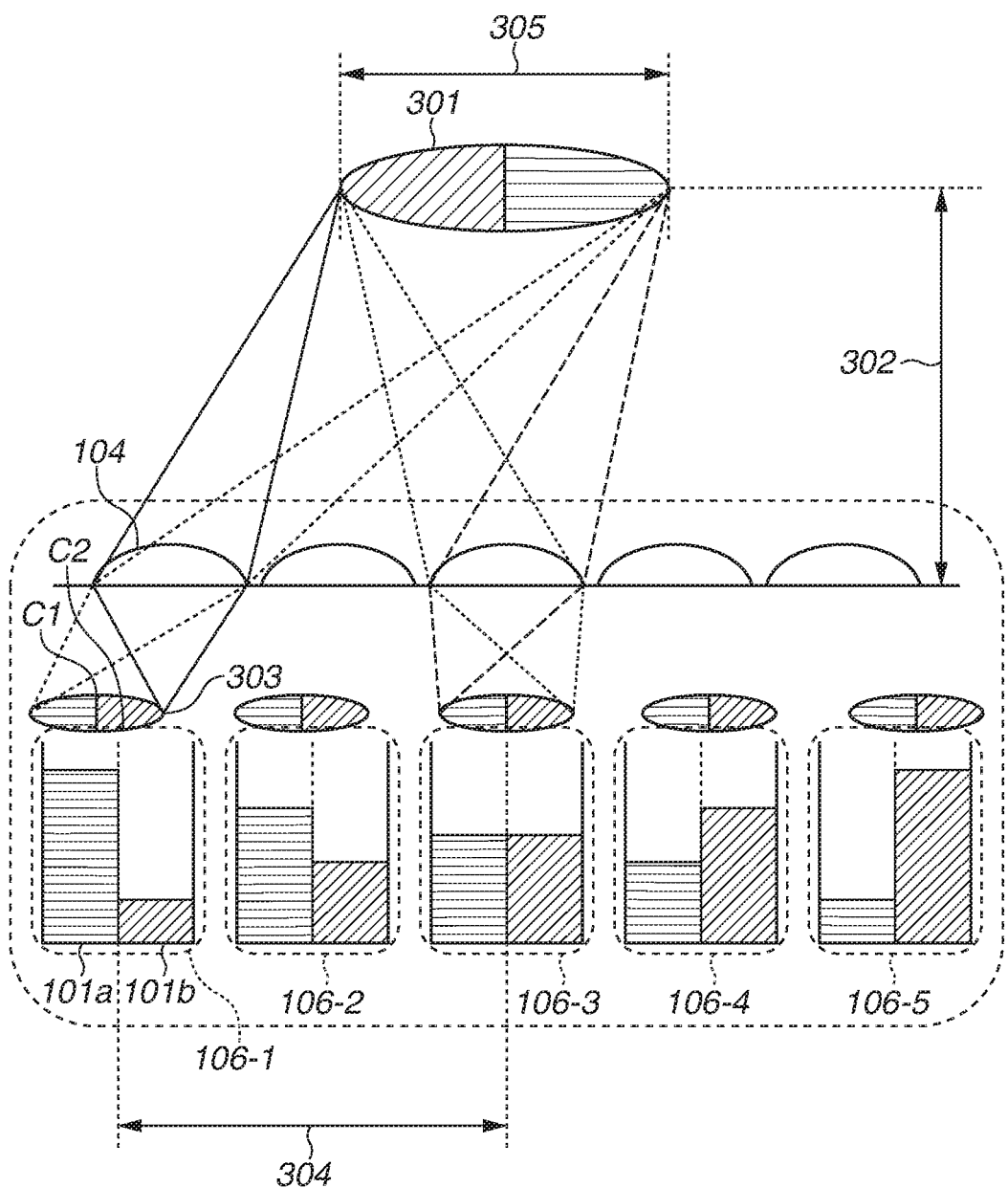
FIG. 5 is a diagram conceptually illustrating a difference in light quantity of each photoelectric conversion element of the photoelectric conversion apparatus according to the first exemplary embodiment.
Figure 6:
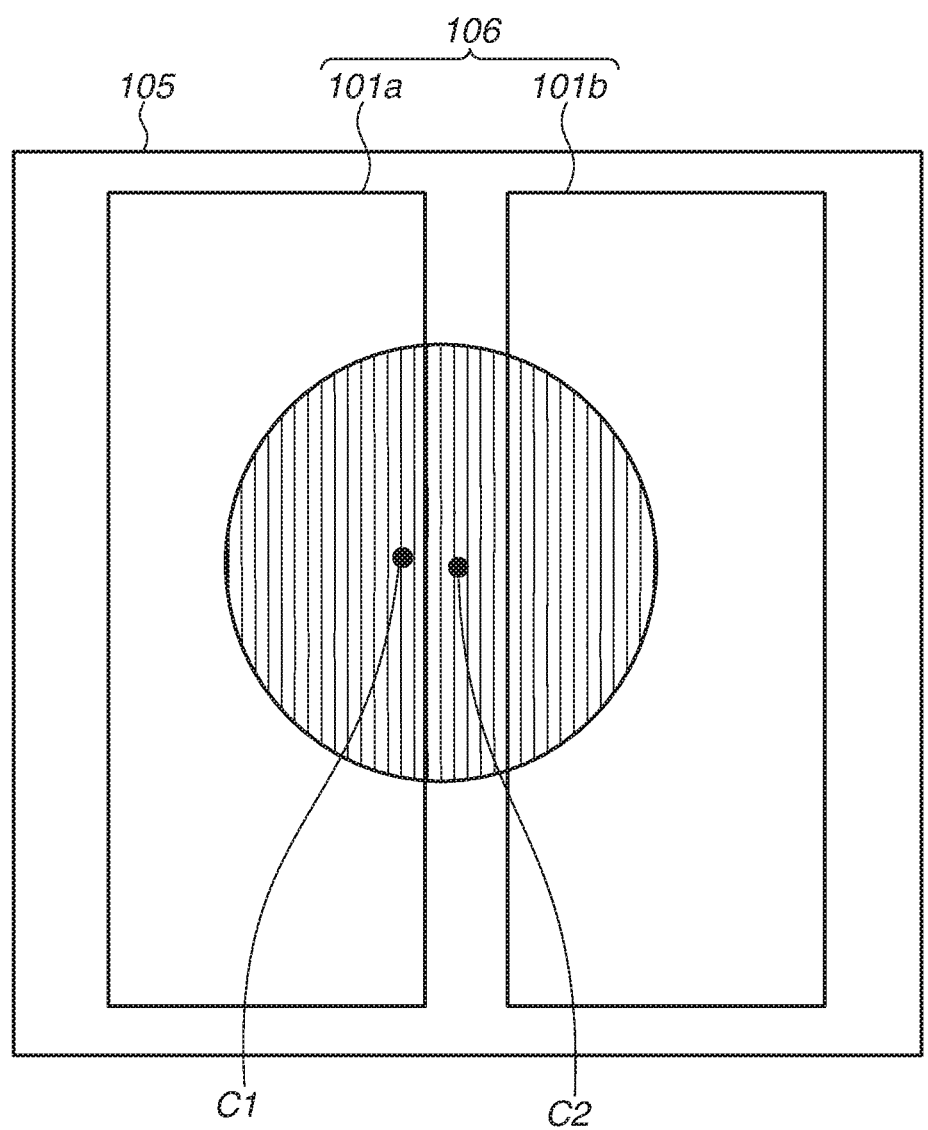
FIG. 6 is a planar view illustrating an exit pupil image and the photoelectric conversion unit of the photoelectric conversion apparatus according to the first exemplary embodiment.
Figure 7:
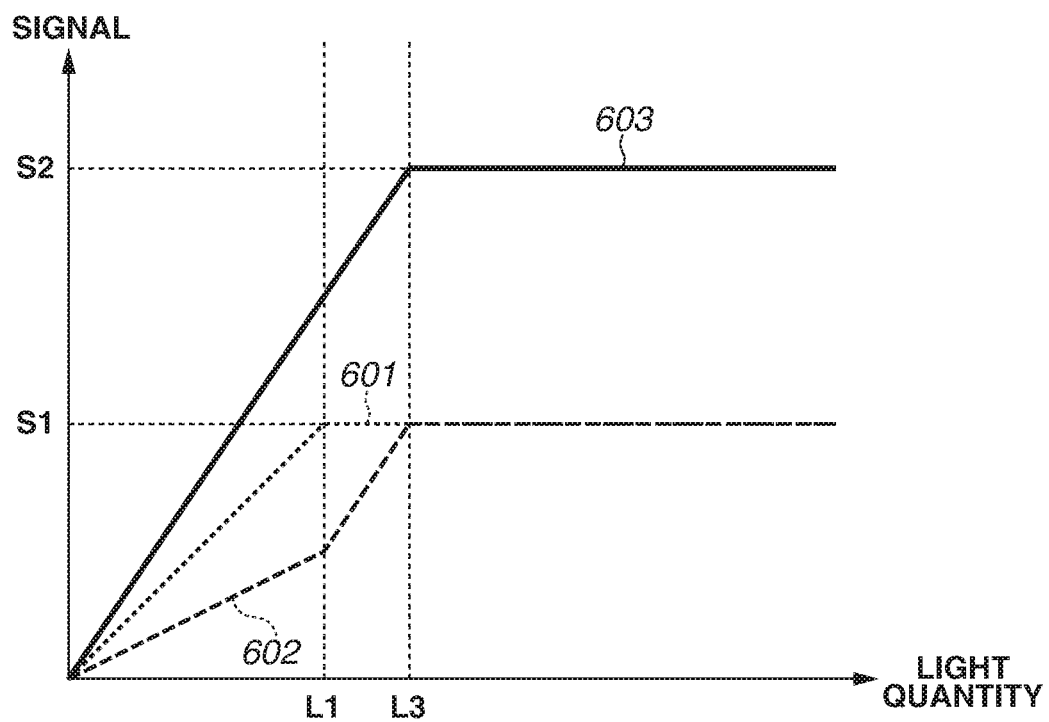
FIG. 7 is a graph illustrating an example of input/output characteristics acquired after signal processing according to the first exemplary embodiment is executed.

FIG. 1 is a block diagram schematically illustrating a photoelectric conversion system including the photoelectric conversion apparatus according to the present exemplary embodiment. FIG. 2 is a schematic diagram illustrating the photoelectric conversion apparatus according to the present exemplary embodiment. FIG. 3 is a planar view illustrating an image capturing region of the image capturing apparatus according to the present exemplary embodiment. FIG. 4 is a block diagram schematically illustrating a pixel circuit of the photoelectric conversion apparatus according to the present exemplary embodiment. FIG. 5 is a diagram conceptually illustrating a difference in light quantity of each of photoelectric conversion elements of the photoelectric conversion apparatus according to the present exemplary embodiment. FIG. 6 is a planar view illustrating an exit pupil image and a photoelectric conversion unit of the photoelectric conversion apparatus according to the present exemplary embodiment. FIG. 7 is a graph illustrating an example of input/output characteristics of a signal acquired by executing signal processing according to the present exemplary embodiment.

Examples of the photoelectric conversion system include various devices such as digital still cameras, digital camcorders, monitoring cameras, copying machines, facsimile machines, mobile phones, in-vehicle cameras, observation satellites, and medical cameras. In FIG. 1, a block diagram of a digital still camera as an example of the photoelectric conversion system is illustrated.

In FIG. 1, a lens unit 1101 forms an optical image of a subject on a photoelectric conversion apparatus 1105. A lens driving apparatus 1102 performs zoom control, focus control, and aperture control. A mechanical shutter 1103 is controlled by a shutter control apparatus 1104. The photoelectric conversion apparatus 1105 acquires the image of the subject formed by the lens unit 1101 as an image signal, and a signal processing circuit 1106 performs various types of correction on the image signal output from the photoelectric conversion apparatus 1105 and compresses data. A timing generation circuit 1107 is a driving unit configured to output various timing signals to the photoelectric conversion apparatus 1105 and the signal processing circuit 1106. A control circuit 1109 performs various types of calculations and controls the entire photoelectric conversion apparatus. A memory 1108 temporarily stores data. An interface 1110 records data onto a recording medium or reads data from the recording medium. A recording medium 1111 is a removable recording medium such as a semiconductor memory for recording and reading data, and a display unit 1112 displays various types of information and captured images. A photometry apparatus 1113 performs light measurement. The photoelectric conversion apparatus according to the present exemplary embodiment is, for example, a complementary metal oxide semiconductor (CMOS) image sensor.

Next, how the digital still camera having the above-described configuration operates during photoelectric conversion will be described below.

When a main power source is turned on, a power source of a control system is turned on, and a power source of a photoelectric conversion system circuit such as the signal processing circuit 1106 is turned on.

Then, when a release button (not illustrated) is pressed, the control circuit 1109 performs ranging calculation based on the data from the photoelectric conversion apparatus 1105 and calculates the distance to the subject based on the ranging result. Thereafter, the lens driving apparatus 1102 drives a lens unit and judges whether the lens unit is in focus state. The digital camera using the photoelectric conversion apparatus according to the present exemplary embodiment is capable of performing high-speed focusing operation.

Details of the photoelectric conversion apparatus will be described below. As illustrated in FIG. 2, the photoelectric conversion apparatus 1105 according to the present exemplary embodiment includes a plurality of stacked substrates. For example, the photoelectric conversion apparatus 1105 includes stacked substrates 710 and 700. The substrate 710 includes a counter circuit and a subsequent-stage circuit, which will be described below, and the substrate 700 includes a plurality of photoelectric conversion elements and a plurality of reset units. The plurality of photoelectric conversion elements is provided on one of the substrates and the counter circuit is provided to the other one of the substrates so that an increase in area of the photoelectric conversion apparatus 1105 in planar view is prevented while the speed of the counter circuit is increased. In a case where a plurality of inverter circuits 103 is connected to the respective plurality of photoelectric conversion elements, some of the inverter circuits 103 may be provided to the substrate 700 and some of the remaining inverter circuits 103 to the substrate 710. Alternatively, the plurality of photoelectric conversion elements, the counter circuit, and the subsequent-stage circuit may be disposed on one substrate.

As illustrated in FIG. 3, the photoelectric conversion apparatus 1105 includes a pixel region 100 in which the plurality of photoelectric conversion elements is two-dimensionally arranged in planar view. Each photoelectric conversion unit 106 includes at least two photoelectric conversion elements. In other words, the plurality of photoelectric conversion elements arranged in the pixel region 100 is divided into a plurality of groups each including at least two photoelectric conversion elements. Each group is referred to as the photoelectric conversion unit 106. Each photoelectric conversion unit 106 is defined by, for example, the plurality of photoelectric conversion elements that is connected to a shared adder. From another point of view, the plurality of photoelectric conversion elements that is arranged below one micro-lens defines one photoelectric conversion unit 106. As described above, each photoelectric conversion unit 106 is a set of plurality of photoelectric conversion elements that satisfies a predetermined condition in common. In the present exemplary embodiment, each photoelectric conversion unit 106 includes two photoelectric conversion elements 101a and 101b. Alternatively, the photoelectric conversion unit 106 can include three or more photoelectric conversion elements. The pixel region 100 is not particularly limited and can include, for example, a 1080-by-1920 array of the photoelectric conversion units 106. FIG. 3 illustrates a 4-by-4 array of the photoelectric conversion units 106 extracted from the 1080-by-1920 array of the photoelectric conversion units 106.

A case of detecting a phase difference using the photoelectric conversion elements included in the photoelectric conversion units 106 will be described below.

In FIG. 3, a micro-lens 104 is disposed so that light is incident on each of the two photoelectric conversion elements 101*a* and 101*b* in order to detect a phase difference. In other words, the plurality of photoelectric conversion elements that is disposed below one micro-lens 104 and is connected to a shared adder defines one photoelectric conversion unit 106.

Even in a case where the photoelectric conversion unit 106 includes a photoelectric conversion element on which light transmitted through a micro-lens is incident and a photoelectric conversion element on which light transmitted through another micro-lens situated at a different position from the position of the micro-lens in planar view is incident, the phase difference detection is executable using the photoelectric conversion elements included in the photoelectric conversion unit 106. For example, the plurality of photoelectric conversion elements on which light transmitted through a micro-lens and light transmitted through another micro-lens are incident and that is arranged point-symmetrically with respect to the respective centers of the micro-lenses in planar view may be included. More specifically, in the example illustrated in FIG. 3, the photoelectric conversion unit 106 may include a photoelectric conversion element (color filter is Ga) that is arranged to overlap the micro-lens at the second row of the first column in planar view and a photoelectric conversion element (color filter is Gb) that is arranged to overlap the micro-lens at the first row of the second column in planar view.

The advantage of the disclosure that the linearity of input/output characteristics is maintained is also produced even in a case of not executing phase difference detection. For example, the advantage of the disclosure can be obtained even in a case of providing one photoelectric conversion element with respect to each micro-lens and connecting the photoelectric conversion element to each counter circuit and adding count values of the plurality of counter circuits.

In FIG. 3, color filters R, G, and B are provided between the micro-lenses 104 and the photoelectric conversion elements 101*a* and 101*b*. The color of each color filter is specified by "R", "G", or "B", and the color filters R, G, and B are respectively red, green, and blue filters. Each color filter provided between the micro-lens 104 and the photoelectric conversion element 101*a* is given the symbol "a". Each color filter provided between the micro-lens 104 and the photoelectric conversion element 101*b* is given the symbol "b". The color filters of the same color are allocated to the two photoelectric conversion elements 101*a* and 101*b* that are included in the same photoelectric conversion unit 106. While an example in which the color filters R, G, and B are arranged in Bayer arrangement is illustrated in FIG. 3, the color filter arrangement is not limited to the example. For example, a transparent filter can be provided in combination with the red, green, and blue filters. Further, a combination of cyan, magenta, and yellow filters may be provided. Further, an infrared filter and/or a near-infrared filter can be provided in addition to a filter for visible light. While the color filters R, G, and B are arranged in a matrix in planar view in FIG. 3, the color filters R, G, and B can be arranged in a staggered manner in planar view.

FIG. 4 is a block diagram illustrating a circuit provided to each photoelectric conversion unit 106 illustrated in FIG. 3. In FIG. 4, the elements/circuits having a similar function may be given the same reference numeral with a different alphabet added at the end to discriminate the elements/circuits. An example is the photoelectric conversion elements 101*a* and 101*b*. When the photoelectric conversion elements 101*a* and 101*b* do not have to be discriminated in the description, the alphabets added at the end such as "a" and "b" are omitted, and a common point is described.

The photoelectric conversion element 101 is, for example, an avalanche amplification type diode. A reverse bias voltage not lower than a breakdown voltage is applied to the photoelectric conversion element 101, and the photoelectric conversion element 101 is set to operate in Geiger mode. More specifically, a first power source voltage is applied to an anode side of the photoelectric conversion element 101 from a first power source line connected to the plurality of photoelectric conversion elements 101, and a second power source voltage is applied to a cathode side of the photoelectric conversion element 101 from a second power source line connected to the plurality of photoelectric conversion elements 101. The voltage difference between the first power source voltage and the second power source voltage is not less than the breakdown voltage. For example, the first power source voltage is −20 V, and the second power source voltage is 3.3 V. The impurity concentration of a positive-type (P-type) semiconductor region of a PN junction of the photoelectric conversion element 101 is, for example, $3E16$ $cm^{-3}$ or higher and not higher than $1E17$ $cm^{-3}$, and the impurity concentration of a negative-type (N-type) semiconductor region of the PN junction of the photoelectric conversion element 101 is, for example, $1E18$ $cm^{-3}$ or higher and not higher than $7E19$ $cm^{-3}$.

A reset unit or reset circuit 102 resets the photoelectric conversion element 101 based on the amount of charge generated at the photoelectric conversion element 101. The reset unit 102 is, for example, a quench element. The quench element is a p-channel metal oxide semiconductor (PMOS) transistor, and the voltage applied across the quench element forms a predetermined quenching resistance. The voltage applied to the quench element is typically 0 V to 2 V.

Next, operations of the photoelectric conversion element 101 and the reset unit 102 will be described. An example in which the photoelectric conversion element 101 is a single photon avalanche diode (SPAD) will be described. If one photon is incident on the photoelectric conversion element 101, a pair of an electron and a hole is generated. Thereafter, the single electron (and the hole) is accelerated by an electric field, and a current is generated by a plurality of electrons (and holes). In other words, the photoelectric conversion element 101 amplifies a photocurrent by avalanche amplification. A current generated by the plurality of amplified electrons flows from a node of a power source voltage to a ground node through the photoelectric conversion element 101 and the quench element. Consequently, the potential of the cathode of the photoelectric conversion element 101 drops, and the operation region of the photoelectric conversion element 101 departs from the Geiger mode. As a result, the avalanche amplification by the photoelectric conversion element 101 is stopped. Then, the power source voltage is supplied to the cathode of the photoelectric conversion element 101 through the quench element, so that the voltage drop due to the quench element is restored. In other words, the operation region of the photoelectric conversion element 101 is restored to the Geiger mode.

The role of the quench element is to decrease the potential of the cathode of the photoelectric conversion element 101, after the avalanche amplification occurs, and then restore the operation region of the photoelectric conversion element 101 to the Geiger mode. The quench element performs the above-described operation to thereby reset the photoelectric conversion element 101.

Next, a condition based on which the reset unit (quench element) 102 resets the photoelectric conversion element 101 will be described. For example, in a case where the photoelectric conversion element 101 is the above-described SPAD, the reset unit 102 resets the photoelectric conversion element 101 based on the amount of multiplication of one generated charge. Thus, whether the reset unit 102 resets the photoelectric conversion element 101 is controlled based on whether at least one charge is generated or no charge is generated. This control is an example of resetting the photoelectric conversion element 101 based on the generated charge amount.

As described above, in the present exemplary embodiment, the reset unit 102 resets the state of the photoelectric conversion element 101 in response to generation of one charge at the photoelectric conversion element 101. Instead of using the avalanche amplification type diode as the photoelectric conversion element 101, a charge accumulation type diode may be used. In this case, the reset unit 102 resets the photoelectric conversion element 101 in response to generation of a predetermined amount of charge. As used herein, the predetermined amount refers to an amount less than the amount of saturated charge of the diode. For example, the reset unit 102 does not perform resetting while the amount of charge generated at the photoelectric conversion element 101 is less than the predetermined amount. When the predetermined amount of charge is generated at the photoelectric conversion element 101, the reset unit 102 resets the photoelectric conversion element 101. This control is also an example of resetting the photoelectric conversion element 101 based on the amount of generated charge.

In another method of resetting the photoelectric conversion element 101 based on the generated charge amount, the reset unit 102 resets the photoelectric conversion element 101 when the predetermined time has passed. In this method, the reset unit 102 resets the photoelectric conversion element 101 regardless of whether charge is generated at the photoelectric conversion element 101. Thus, this method is different from the resetting based on the generated charge amount. Obviously, the control to reset the photoelectric conversion element 101 when the predetermined time has passed may be used in combination in the present exemplary embodiment.

As a result that the potential of the cathode of the photoelectric conversion element 101 is input, the inverter circuit 103 inverts the input potential and outputs the inverted potential. Whether a photon is incident on the photoelectric conversion element 101 can be shaped into a pulse by the inverter circuit 103. As described above, if a photon is incident on the photoelectric conversion element 101, the potential of the cathode of the photoelectric conversion element 101 drops. Since the cathode of the photoelectric conversion element 101 is connected to the inverter circuit 103, if the potential of the cathode is higher than a threshold value of the inverter circuit 103, the output of the inverter circuit 103 is a low level. On the other hand, if the potential of the cathode is lower than the threshold value of the inverter circuit 103, the output of the inverter circuit 103 is a high level. In other words, the output of the inverter circuit 103 is substantially binarized. Thus, a rectangular pulse is output from the inverter circuit 103 in response to the incidence of light on the photoelectric conversion element 101.

In the present exemplary embodiment, as illustrated in FIG. 4, the inverter circuit 103 is connected to a counter circuit 204. The counter circuit 204 counts the number of pulses output from the inverter circuit 103 and outputs the accumulated count value to an output line. In other words, if the counter circuit 204 receives a pulse from the inverter circuit 103, the counter circuit 204 changes the count value. As described above, the inverter circuit 103 outputs a pulse in response to the incidence of light on the photoelectric conversion element 101. In other words, a signal generated by the photoelectric conversion element 101 is input to the counter circuit 204 through the inverter circuit 103. As a result, the counter circuit 204 performs counting to change the count value in response to the signal from the photoelectric conversion element 101. As a result, the counter circuit 204 can count the number of times a photon is incident on the photoelectric conversion element 101. Whether the counter circuit 204 performs counting is controlled depending on whether at least one charge is generated or no charge is generated at the photoelectric conversion element 101. This control is an example of changing the count value in response to the signal from the photoelectric conversion element 101. In a case where no charge is generated at the photoelectric conversion element 101, the counter circuit 204 does not change the count value. On the contrary, a counter circuit used in analog-digital (AD) conversion changes a count value in response to a clock signal regardless of whether a charge is generated. The counting according to the present exemplary embodiment is different from such a counting operation.

For example, in a case where the photoelectric conversion element 101 is the SPAD, the counter circuit 204 changes the count value in response to the incidence of a single photon on the photoelectric conversion element 101. In a case where the photoelectric conversion element 101 is the charge accumulation type diode, the counter circuit 204 changes the count value if a predetermined amount of charge is generated at the photoelectric conversion element 101 as a result of incidence of light. This operation is generally referred to as photon counting. In photon counting, the amplified charge amount is significantly greater than the generated signal charge amount, so that the signal-to-noise (SN) ratio is improved. Further, since A/D conversion is unnecessary, the signal calculation processing becomes easier.

The number of bits of the counter circuit 204 is n bits (n is an integer not less than two). The counter circuit 204 outputs a binary code. For example, in a case of three bits, the count value is changed to "000", "001", "010", "011" . . . .

FIG. 5 is a cross sectional view schematically illustrating the photoelectric conversion elements 101a and 101b, the micro-lens 104, and an exit pupil 301 of the imaging lens and conceptually illustrating a difference in light quantity of the photoelectric conversion elements 101a and 101b. Light transmitted through the exit pupil 301 of the imaging lens is incident on the photoelectric conversion apparatus 1105 arranged at an exit pupil distance 302. As described above, the photoelectric conversion apparatus 1105 includes the photoelectric conversion unit 106 including the two photoelectric conversion elements 101a and 101b and the micro-lens 104. Typically, the size of the exit pupil 301 of the imaging lens is on the order of millimeters, whereas the size of the photoelectric conversion unit 106 is on the order of micrometers. Illustration at the actual ratio causes difficulty in description, so that in FIG. 5, a portion of the components of the photoelectric conversion apparatus 1105 is extracted and enlarged.

The exit pupil 301 of the imaging lens and the micro-lens 104 form an exit pupil image 303 on a surface of the photoelectric conversion unit 106. While the exit pupil 301 and the exit pupil image 303 each are in a line shape in cross-sectional view, the exit pupil 301 and the exit pupil image 303 are illustrated as an oval in bird's eye view in FIG. 5 in order to simplify the description. FIG. 6 is a planar view illustrating the exit pupil image 303 and the photoelectric conversion unit 106 including the photoelectric conversion elements 101a and 101b on which light transmitted through one micro-lens is incident. It is assumed that the quantity of incident light is uniform across the entire exit pupil image 303. As illustrated in FIG. 6, there is a case where the exit pupil image 303 and the photoelectric conversion elements 101a and 101b do not overlap partially. In this case, as illustrated in FIG. 6, there is a case where a center C1 of the exit pupil image 303 and a center C2 of a region including the photoelectric conversion elements 101a and 101b (hereinafter, referred to as "center C2"), and the space between the photoelectric conversion elements 101a and 101b do not match. In this case, there is a difference in quantity of incident light between the two photoelectric conversion elements 101a and 101b of one photoelectric conversion unit 106. The center C2 refers to a center of lines connecting diagonal end portions of two photoelectric conversion elements separated by a separation region 105 in planar view. The separation region 105 is, for example, a local oxidation of silicon (LOCOS) or shallow trench isolation (STI) region or a PN junction separation region.

In FIG. 5, a photoelectric conversion unit 106-3 is an example in which the center C1 of the exit pupil image 303 and the center C2 match and there is no difference in quantity of light incident on the photoelectric conversion elements. Photoelectric conversion units 106-1 and 106-5 are an example in which there is a significant deviation between the center C1 of the exit pupil image 303 and the center C2 and there is a significant difference in quantity of light incident on the photoelectric conversion elements. Photoelectric conversion units 106-2 and 106-4 are an example in which there is a moderate deviation between the center C1 of the exit pupil image 303 and the center C2 and there is a moderate difference in quantity of light incident on the photoelectric conversion elements.

In FIG. 5, the area of each shaded portion of the photoelectric conversion element 101 corresponds to a count value of a counter circuit that is determined by the number of photons incident on the photoelectric conversion element 101. A cause of a change in the center of the exit pupil image 303 is the exit pupil distance 302 of the imaging lens and a horizontal image height 304, and a cause of a change in diameter of the exit pupil image 303 is a pupil diameter 305 of the imaging lens. The amount of the difference in light quantity between the photoelectric conversion elements 101a and 101b is determined based on the center and diameter of the exit pupil image 303. For example, in a case of a lens interchangeable camera, the exit pupil distance 302 is changed by the lens, and the pupil diameter 305 of the image capturing lens is changed by an aperture (F-number). In a photoelectric conversion apparatus for use in a lens interchangeable camera, there is likely a difference in light quantity between the plurality of photoelectric conversion elements, so that the advantage that the linearity of input/output characteristics is increased becomes significant in the case where there is a difference in quantity of incident light.

In the present exemplary embodiment, an image signal for forming a captured image is acquired by adding the count values of the counter circuits 204a and 204b together.

Figure 13:
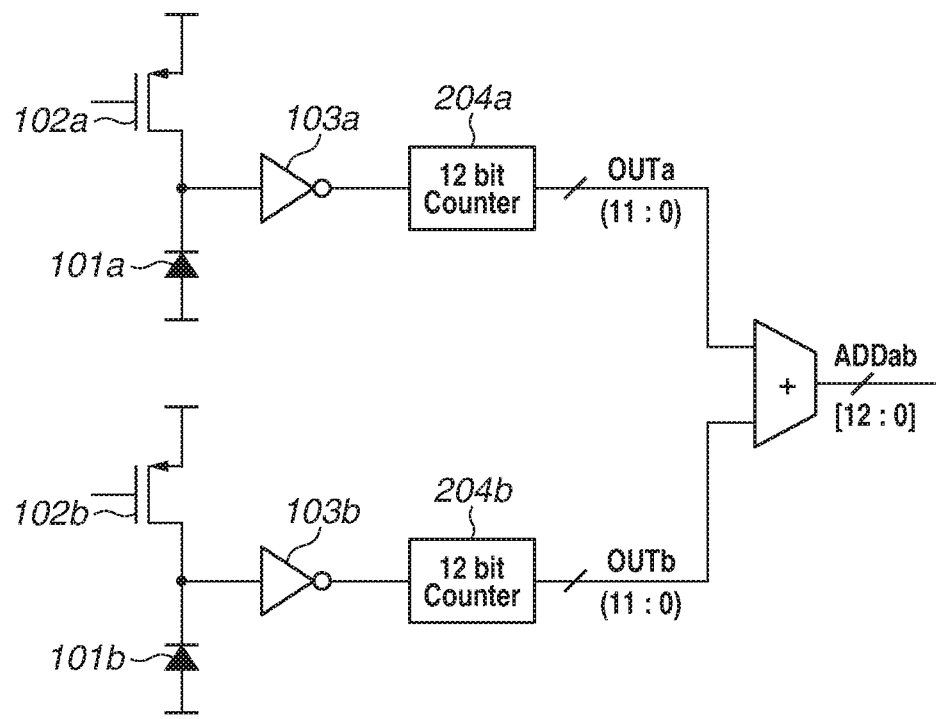
FIG. 13 is a block diagram schematically illustrating a circuit including a photoelectric conversion unit of a photoelectric conversion apparatus according to a comparative example.

A photoelectric conversion apparatus according to a comparative example and input/output characteristics of a signal acquired from the photoelectric conversion apparatus according to the comparative example will be described below with reference to FIGS. 13 and 14. FIG. 13 is a block diagram illustrating the photoelectric conversion apparatus according to the comparative example. In FIG. 13, the photoelectric conversion element 101, the reset unit 102, and the inverter circuit 103 have a configuration similar to that described above. In the comparative example, the counter circuit 204 of n−1 bits is included. For description, it is assumed that n−1=12. The count value of the counter circuit 204 ranges 4096 steps from a value in which all of the 12 bits are "0" (0 in decimal notation) to a value in which all of the 12 bits are "1" (4095 in decimal notation).

In a case where the quantity of light incident on a first photoelectric conversion element is greater than the quantity of light incident on a second photoelectric conversion element, the count value may be saturated only at a counter circuit connected to the first photoelectric conversion element. For example, in FIG. 13, there is a case where all of the 12 bits of the counter circuit 204a become "1" and one or some of the 12 bits of the counter circuit 204b are "0". In other words, the counter circuit 204a outputs a maximum value, whereas the counter circuit 204b outputs a count value less than the maximum value. In this case, even if light is incident on the photoelectric conversion element 101a, since the count value of the counter circuit 204a is saturated, the counting operation cannot be continued or the count value is looped to the initial value. As a result, adding the count value of the counter circuit 204a connected to the photoelectric conversion element 101a and the count value of the counter circuit 204b connected to the photoelectric conversion element 101b may degrade the linearity of the input/output characteristics.

Figure 14:
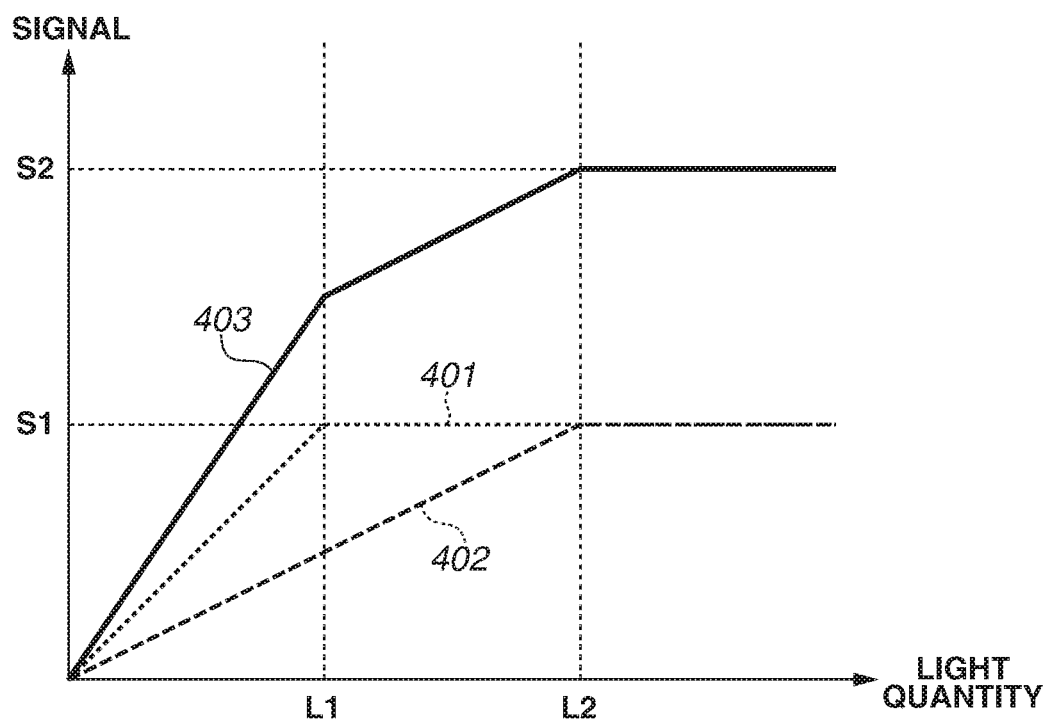
FIG. 14 is a graph illustrating an example of input/output characteristics of the photoelectric conversion unit according to the comparative example.

FIG. 14 is a graph illustrating an input/output characteristic 401 of the count value counted by the counter circuit 204a, an input/output characteristic 402 of the count value counted by the counter circuit 204b, and an input/output characteristic 403 obtained by combining the input/output characteristics 401 and 402. The horizontal axis represents the quantity of light incident on one photoelectric conversion unit 106, and the vertical axis represents the count value.

A portion of the light incident on one photoelectric conversion unit 106 is incident on the photoelectric conversion element 101a, and another portion of the light is incident on the photoelectric conversion element 101b. The ratio is not always 1:1 and varies depending on the position of the photoelectric conversion unit 106 as described above with reference to FIG. 5. In FIG. 14, the gradient of the input/output characteristic 401 and the gradient of the input/output characteristic 402 are different because the quantity of light incident on the photoelectric conversion element 101a is greater than the quantity of light incident on the photoelectric conversion element 101b.

Since the quantity of light incident on the photoelectric conversion element 101a is greater than the quantity of light incident on the photoelectric conversion element 101b, when the quantity of light incident on the photoelectric conversion unit 106 increases, first, the count value of the counter circuit 204a reaches the maximum value. Further, when the quantity of incident light increases, the count value of the counter circuit 204b reaches the maximum value. More specifically, when the quantity of light incident on the photoelectric conversion unit 106 exceeds a light quantity L1, all of the bits of the counter circuit 204a become "1". In other words, the light quantity L1 is a light quantity at the time at which the count value of the counter circuit 204a is saturated. In the example illustrated in FIG. 14, a value S1 is the count value (count value is 4095) in the state in which all of the bits of the counter circuit 204a are "1". When all of the bits of the counter circuit 204a become "1", the counter circuit 204a stops counting to prevent, for example, an overflow and a start of the second counting. Thus, even if light continues to be incident on the photoelectric conversion element 101a, since the counter circuit 204a cannot perform counting operation, the count value no longer changes from a predetermined count value. On the other hand, even after the quantity of incident light exceeds the light quantity L1, the counter circuit 204b can continue the counting operation until the light quantity reaches a light quantity L2. When the quantity of light incident on the photoelectric conversion unit 106 exceeds the light quantity L2, all of the bits of the counter circuit 204b become "1", and the counter circuit 204b can no longer continue the counting operation, as in the case of the counter circuit 204a. In other words, the light quantity L2 of light incident on the photoelectric conversion unit 106 is the light quantity at the time at which the count value of the counter circuit 204b is saturated.

As illustrated in FIG. 14, the gradient of the input/output characteristic 403 obtained by combining the input/output characteristics 401 and 402 becomes smaller and the linearity is degraded at the light quantity L1 or greater, because after the light quantity exceeds the light quantity L1, the counter circuit 204a stops the counting operation. The input/output characteristic 403 at the light quantity L2 or greater becomes a count value S2 (=2×S1) obtained by adding the count value at the time at which the count value of the counter circuit 204a is saturated and the count value at the time at which the count value of the counter circuit 204b is saturated. As illustrated in FIG. 14, after one of the counter circuits reaches a saturation value, even if light is incident on the photoelectric conversion element, the counter circuit can no longer continue the counting operation, and the linearity of the input/output characteristic of the signal obtained by adding the count values of the two counter circuits is degraded.

On the other hand, a signal processing method according to the present exemplary embodiment prevents the linearity of the input/output characteristic from degrading which can occur in the case of adding the count values of a plurality of counter circuits. The signal processing method according to the present exemplary embodiment will be described below with reference to FIG. 4. FIG. 4 is a block diagram schematically illustrating a circuit including the photoelectric conversion unit 106 according to the present exemplary embodiment. In the present exemplary embodiment, a detection unit configured to detect an event that the counter circuit 204 exceeds the threshold value is included. The inclusion of the detection unit enables detection of saturation of the count of the counter circuit 204 so that the linearity of the input/output characteristic is prevented from degrading which can occur in the case of adding the count numbers of the counter circuits 204.

As illustrated in FIG. 4, in the present exemplary embodiment, the counter circuit 204 is extended upward by 1 bit with respect to the counter circuit 204 according to the comparative example. More specifically, the number of bits of the counter circuit 204 is n bits. Further, an output line 205 through which the count value output from the counter circuit 204 is transmitted and that is not connected to the adder is provided separately from the output line through which the count value output from the counter circuit 204 is transmitted and that is connected to the adder. The output line 205 that is not connected to the adder is connected to an OR circuit 503 configured to function as the detection unit or a detector according to the present exemplary embodiment. The detection unit detects an event that the count value of the counter circuit 204 exceeds the threshold value. More specifically, when COUNTa[12], which is the most significant bit, is "1", the OR circuit 503 configured to function as the detection unit according to the present exemplary embodiment detects an event that the count value of the counter circuit 204 exceeds the threshold value.

In the present exemplary embodiment, the threshold value is a value in which all bits that are less significant than the most significant bit are "1". More specifically, in FIG. 4, the threshold value is a value in which all of the count values COUNTa[11:0] of the 12 bits that are less significant than the most significant bit (i.e., bit 13), are "1". In decimal notation, the counter circuit 204 of 13 bits can output a count value of 8192 steps ranging from 0 to 8191. The value in which all of the count values COUNTa[11:0] of the 12 less significant bits are "1" is half the maximum count value. In other words, the value that is half the maximum count value is set as the threshold value in the present exemplary embodiment.

After the count value of the counter circuit 204 exceeds the threshold value, a signal obtained by COUNTa[11:0] counting from 0 again is used as a signal to be output to an adder 506. As used herein, [11:0] refers to a count value of 12 bits in total with "0" being the least significant bit and "11" being the most significant bit. Further, a certain bit is denoted [n].

Further, the threshold value is not limited to the value in which all the 12 bits that are less significant than the most significant bit (i.e., bit 13) are "1". For example, a value in which all of the bits that are less significant than bit 12 of the counter circuit 204 of 13 bits are "1" can be set as the threshold value. In this case, a value that is ¼ the maximum value is the threshold value. Setting the threshold value to a value of ½$^n$ of the maximum value like this makes it possible to simplify the configuration of the detection unit. Specifically, an event that the count value exceeds the threshold value is detectable by simply detecting an event that "1" is output from the most significant bit in the present exemplary embodiment.

According to a modified example, the threshold value can be set to any value. In this case, a comparison circuit configured to compare the count value of the counter circuit 204 with a predetermined count value is provided. In this case, when each bit becomes a value corresponding to a predetermined value, an event that the predetermined value is exceeded is detected. While the circuit size increases, there is an advantage that the threshold value is freely settable.

The detection unit makes it possible to maintain the linearity of the input/output characteristic of the added signal. In FIG. 4, the OR circuits 503 and 508 each configured to function as the detection unit are respectively connected to the counter circuits 204a and 204b. With this configuration, the linearity of the input/output characteristic of the added signal is maintained regardless of whether the photoelectric conversion element on which a relatively greater quantity of light is incident is the photoelectric conversion element 101a or 101b. In other words, the linearity of the input/output characteristic of the added signal is maintained regardless of the position of the photoelectric conversion unit 106 on which light is incident in the pixel region 100. Alternatively, only one of the counter circuits 204 may include the detection unit while the other one of the counter circuits 204 may include no detection unit. For example, the detection unit may be provided only to the counter that counts the count value based on the photoelectric conversion element on which light is more likely to be incident, while no detection unit may be provided to the counter that counts the count value based on the photoelectric conversion element on which light is less likely to be incident.

In the present exemplary embodiment, the counter circuit 204 outputs a binary-code count value. When the most significant bit COUNTa[12] becomes "1", a signal is output from an output line 205a, and an event that the counter circuit 204a exceeds the threshold value is detected. Then, counting of COUNTa[11:0] of the 12 less significant bits is started from 0 again. Focusing on COUNTa[11:0] of the 12 less significant bits of the counter circuit 204a, this is equivalent to the resetting of the count value of the counter circuit 204 of 12 bits.

The counter circuits 204a and 204b are connected to the adder 506. The counter circuit 204a outputs signal COUNTa[11:0] of the 12 less significant bits of the count value to the adder 506. The counter circuit 204b outputs signal COUNTb[11:0] of the 12 less significant bits of the count value to the adder 506. The counter circuit 204a outputs signal COUNTa[12] of the most significant bit of the count value to the OR circuit 503, an AND circuit 507, and a multiplexer 505. The counter circuit 204b outputs signal COUNTb[12] of the most significant bit of the count value to the OR circuit 508, an AND circuit 502, and a multiplexer 501.

The counter circuit 204a and the adder 506 are connected via part of the plurality of output lines through which a signal output from the counter circuit 204a is transmitted. Further, the counter circuit 204a and the OR circuit 503 are connected via the output line 205a, which is another part of the plurality of output lines, through which a signal output from the counter circuit 204a is transmitted. Further, the output line 205a, which is the other part of the plurality of output lines, is connected to the AND circuit 507 and the multiplexer 505. Similarly, the counter circuit 204b and the adder 506 are connected via part of the plurality of output lines through which a signal output from the counter circuit 204b is transmitted. Further, the counter circuit 204b and the OR circuit 508 are connected via an output line 205b, which is another part of the plurality of output lines, through which a signal output from the counter circuit 204b is transmitted. The output line 205b, which is the other part of the plurality of output lines, is further connected to the multiplexer 501 and the AND circuit 502.

To the adder 506, COUNTa[11:0] of the counter circuit 204a and COUNTb[11:0] of the counter circuit 204b are input. The adder 506 outputs count value ADDab[11:0] obtained by adding COUNTa[11:00] and COUNTb[11:0] to the multiplexers 501 and 502. The adder 506 outputs a carry signal (hereinafter, referred to as "CARRY") to the AND circuits 502 and 507. The CARRY is "0" when the count value obtained by adding COUNTa[11:0] of the counter circuit 204a and COUNTb[11:0] of the counter circuit 204b is not more than the threshold value. The CARRY is changed to "1" when the count value obtained by adding COUNTa[1:0] of the counter circuit 204a and COUNTb[11:0] of the counter circuit 204b exceeds the threshold value. In the present exemplary embodiment, the CARRY is changed to "1" when the count value obtained by adding COUNTa[1:00] and COUNTb[11:0] exceeds the maximum value (4095 in decimal notation) of the adder 506.

To the AND circuit 502, COUNTb[12] of the counter circuit 204b and the CARRY of the adder 506 are input. The AND circuit 502 outputs "1" to the OR circuit 503 only when COUNTb[12] is "1" and the CARRY of the adder 506 is "1", whereas on any other conditions, the AND circuit 502 outputs "0" to the OR circuit 503.

To the AND circuit 507, COUNTa[12] of the counter circuit 204a and the CARRY of the adder 506 are input. The AND circuit 507 outputs "1" to the OR circuit 508 only when COUNTa[12] is "1" and the CARRY of the adder 506 is "1", whereas on any other conditions, the AND circuit 507 outputs "0" to the OR circuit 508.

To the OR circuit 503, the output of the AND circuit 502 and COUNTa[12] of the counter circuit 204a are input. The OR circuit 503 outputs "1" to a multiplexer (output unit) 504 when at least one of COUNTa[12] and the output of the AND circuit 502 is "1". The OR circuit 503 outputs "0" to the multiplexer 504 when COUNTa[12] is "0" and the output of the AND circuit 502 is "0".

To the OR circuit 508, the output of the AND circuit 507 and COUNTb[12] of the counter circuit 204b are input. The OR circuit 508 outputs "1" to a multiplexer 509 when at least one of COUNTb[12] and the output of the AND circuit 507 is "1". The OR circuit 508 outputs "0" to the multiplexer 509 when COUNTb[12] is "0" and the output of the AND circuit 507 is "0".

To the multiplexer 501, COUNTa[11:0] of the counter circuit 204a, ADDab[11:0] of the adder 506, and COUNTb[12] of the counter circuit 204b are input. The multiplexer 501 selectively outputs COUNTa[11:0] of the counter circuit 204a or ADDab[11:0] of the adder 506 depending on COUNTb[12] of the counter circuit 204b. When COUNTb[12] of the counter circuit 204b is "1", the count value of the counter circuit 204b is saturated, so that the multiplexer 501 outputs ADDab[11:0] of the adder 506. Further, when COUNTb[12] of the counter circuit 204b is "0", the count value of the counter circuit 204b is not saturated, so that the multiplexer 501 outputs COUNTa[11:0] of the counter circuit 204a.

To the multiplexer 505, COUNTb[11:0] of the counter circuit 204b, ADDab[11:0] of the adder 506, and COUNTa[12] of the counter circuit 204a are input. The multiplexer 505 selectively outputs COUNTb[11:0] of the counter circuit 204b or ADDab[11:0] of the adder 506 depending on COUNTb[12] of the counter circuit 204a. When COUNTa[12] of the counter circuit 204a is "1", the count value of the counter circuit 204a is saturated, so that the multiplexer 505 outputs ADDab[11:0] of the adder 506. Further, when COUNTa[12] of the counter circuit 204a is "0", the count value of the counter circuit 204a is not saturated, so that the multiplexer 505 outputs COUNTb[11:0] of the counter circuit 204b.

As illustrated in FIG. 4, the two output units 504 and 509 (i.e., multiplexers 504 and 509) are included in the present exemplary embodiment. Each of the two output units 504 and 509 selects an output value based on whether the detection unit detects an event that the count value of the counter circuit 204a or 204b exceeds the threshold value, and each of the output units 504 and 509 outputs the selected value. In the present exemplary embodiment, a first output unit outputs a count value of a first counter or another value, and a second output unit outputs a count value of a second counter or another value. The second output unit selects the count value of the adder or the predetermined value based on whether the CARRY is output, and the second output unit outputs the selected value. An example will be described below.

FIG. 7 is a graph illustrating an example of an input/output characteristic 601 of the multiplexer 504, an input/output characteristic 602 of the multiplexer 509, and an input/output characteristic 603 obtained by combining the input/output characteristics 601 and 602. The horizontal axis represents the quantity of light incident on the photoelectric conversion elements 101a and 101b, and the vertical axis represents the count value. As illustrated in FIG. 4, the photoelectric conversion apparatus includes the photoelectric conversion elements 101a and 101b, the counter circuits 204a and 204b, the output lines 205a and 205b of the most significant 1 bit of the counter circuits 204a and 204b, and the adder 506. According to the present exemplary embodiment, the linearity of the input/output characteristics is improved. As in the description with reference to FIG. 14, the quantity of light incident on the photoelectric conversion unit 106 when the counter circuit 204a is saturated is a light quantity L1. Further, the quantity of light incident on the photoelectric conversion unit 106 when the counter circuit 204b is saturated is a light quantity L3. In other words, the light quantity L3 is a light quantity at which the CARRY of the adder 506 is "1". Three cases in which the quantity of incident light is less than L1, not less than L1 and less than L3, and not less than L3 will be described below.

First, the case where the quantity of incident light is less than L1 will be described. In this case, COUNTa[12] and COUNTb[12] are "0", so that the multiplexer 501 outputs COUNTa[11:0]. Further, the output of the AND circuit 502 is "0", so that the output of the OR circuit 503 is also "0". Thus, the output OUTa[11:0] of the multiplexer 504 is COUNTa[11:0]. Similarly, COUNTb[11:0] is output from OUTb[11:0]. As described above, when the quantity of incident light is less than L1, the signal from each photoelectric conversion element 101 is directly output.

Next, the case where the quantity of incident light is not less than L1 and less than L3 will be described below. In this case, COUNTa[12] is "1" and COUTNb[12] is [0]. Accordingly, the output of the OR circuit 503 is "1", and the output OUTa[11:0] of the multiplexer 504 is 4095. Meanwhile, ADDab[11:0] obtained by adding additional signals COUNTa[11:0] and COUNTb[11:0] by the adder 506 of 12 bits with carry is output from the multiplexer 505. The additional signals are signals obtained through a counting operation performed after the threshold value is exceeded. Further, when the quantity of incident light is less than L3, the CARRY of the adder 506 is "0", so that the output of the AND circuit 507 is "0". Accordingly, the output of the OR circuit 508 is also "0", and the output of the multiplexer 509 is the additional signal ADDab. As illustrated in FIG. 7, the gradient of the input/output characteristic 602 becomes larger than that when the quantity of incident light is less than L1, so that the linearity of the combined input/output characteristic 603 improves.

In general, the least significant bit of [11:0] is 4096, and according to a principle of the circuit in the present exemplary embodiment, when the least significant bit of ADDab[11:0] becomes 4096, "1" is output from CARRY. Thus, the least significant bit of ADDab[11:0] becomes 4095, which is smaller by 1 LSB than the general LSB of 12 bits. While this does not cause a problem in many cases, it may be useful to provide an additional configuration for correcting the error.

Next, the case where the quantity of incident light is not less than L3 will be described. The quantity of incident light is not less than L1, so that OUTa[11:0] is 4095 as described above. Further, COUNTa[12] and CARRY are both "1", so that the output of the AND circuit 507 is "1". Consequently, the output of the OR circuit 508 is "1", so that the output OUTb[11:0] of the multiplexer 509 is 4095.

In the present exemplary embodiment, if the signal value of the most significant bit of the counter circuit 204 is changed, counting resetting is performed to reset a signal that is less than the most significant bit. After the counting resetting is performed, the counting is continued. A count value obtained by continuing the counting operation after the counting resetting is performed and a count value from the counter circuit connected to the photoelectric conversion element, the count value of which is not saturated, are added and output. In this way, the linearity of the input/output characteristics when the signals of the photoelectric conversion elements having a difference in light quantity are added and output improves.

The case of performing counting resetting is not limited to the case where the signal value of the most significant bit is changed. For example, counting resetting may be performed in a case where a signal of a predetermined bit is changed. Alternatively, the count value of the counter circuit 204 is compared with a predetermined count value, and counting resetting is performed depending on the comparison result.

The counter circuit 204 is not limited to a counter circuit configured to output a binary-code count value and may be a counter circuit configured to output a Gray-code count value. The Gray code refers to a code in which two successive values differ in only one bit. Use of the Gray code can reduce an error because the difference in bit is small. When the counter circuit 204 outputs a Gray-code count value, the value in which the most significant bit is "1" can be set as the threshold value, as in the case of outputting a binary-code count value. Alternatively, the value is compared with the predetermined count value to detect whether the value exceeds the threshold value, and counting resetting is performed depending on the result.

The number of bit lines connected to the multiplexer 504 is less than the number of bit lines connected to the counter circuit 204a. Similarly, the number of bit lines connected to the multiplexer 509 is less than the number of bit lines connected to the counter circuit 204b. This makes it possible to improve the linearity of the combined input/output characteristic 603 without increasing the bit lines of the subsequent-stage circuit. Further, the number of bits output from the multiplexer 504 is less than the number of bits output from the counter circuit 204a. Similarly, the number of bits output from the multiplexer 509 is less than the number of bits output from the counter circuit 204b. This makes it possible to improve the linearity of the combined input/output characteristic 603 without increasing the bit lines of the subsequent-stage circuit. Further such advantages are obtained that the number of bits of a memory MEM is reduced, the bit rate of an output interface from a digital front end DFE is reduced, and the processing load on a digital signal processor DSP is reduced.

The case where the quantity of incident light is less than L1 is a case where each output from the photoelectric conversion elements 101a and 101b does not exceed the threshold value. In this case, phase difference detection is executable using the output OUTa[11:0] of the multiplexer 504, which is the first output unit, and the output OUTb[11:0] of the multiplexer 509, which is the second output unit. When the quantity of incident light is not less than L1, the signal output from at least one of the multiplexers 504 and 509 is a signal obtained by adding the signals of the photoelectric conversion elements 101a and 101b. When the quantity of incident light is not less than L1, the accuracy of phase difference detection decreases, so that phase difference detection may not be performed.

The memory MEM, the digital front end DFE, and the count value processing circuit DSP may be provided as a subsequent-stage circuit in FIG. 4. The combining of OUTa [11:0] and OUTb[11:0] is performed by the subsequent-stage circuits. It is desirable that the subsequent-stage circuits are provided to a substrate different from the substrate including the counter circuit, and the substrate including the counter circuit and the substrate including the subsequent-stage circuits are layered, as illustrated in FIG. 1.

The photoelectric conversion apparatus according to the present exemplary embodiment includes two output units to perform phase difference detection. The configuration of the photoelectric conversion apparatus is not limited to the above-described configuration, and the photoelectric conversion apparatus may be configured to add the count values of a plurality of counter circuits and output the added value from one output unit.

Further, the circuits illustrated in FIG. 4 are a mere example. As described above, any circuit can be employed that is capable of detecting the saturation of the count value of the counter circuit and a carry-over during addition by the adder, and selectively outputting the count value depending on whether the count value is saturated, and improving the input/output characteristic. For example, in the present exemplary embodiment, whether the count value of the counter circuit 204a or the predetermined value is to be output is determined through a logical calculation performed by the AND circuit 502 and the OR circuit 503. A modified example of a combination of logical circuits capable of producing the same logical calculation result can be employed.

An photoelectric conversion apparatus and a signal processing method according to a second exemplary embodiment will be described below with reference to FIG. 8. Each component similar to that in the photoelectric conversion apparatus and the signal processing method according to the first exemplary embodiment is given the same reference numeral, and description thereof is omitted or simplified.

The configuration up to the output of the photoelectric conversion elements 101a and 101b is similar to that in FIG. 4. In the present exemplary embodiment, a counter circuit is provided on the substrate 710 different from the substrate 700 on which the photoelectric conversion elements 101a and 101b are provided. Further, the counter circuit provided on the substrate 710 and the memory MEM provided on a substrate 720 different from the substrate 710 are connected. The memory MEM is connected to the digital front end DFE, and the digital front end DFE is connected to the digital signal processor DSP block. Further, the additional signal addition processing in FIG. 4 is performed by the digital front end DFE or the digital signal processor DSP block. More specifically, while each photoelectric conversion unit 106 needs an additional signal addition processing circuit in the first exemplary embodiment, an additional signal addition processing circuit is provided to the digital front end DFE block or the digital signal processor DSP block shared by the plurality of photoelectric conversion units 106 in the present exemplary embodiment. In this way, the circuit size can be reduced. Even in this case, such advantages are obtained that the bit rate of the output interface from the digital front end DFE is reduced and the processing load on the digital signal processor DSP is reduced.

The memory MEM, the digital front end DFE, and the digital signal processor DSP block may be provided outside the photoelectric conversion apparatus.

An photoelectric conversion apparatus and a signal processing method according to a third exemplary embodiment will be described below with reference to FIGS. 9 and 10. Each component similar to that in the photoelectric conversion apparatus and the signal processing method according to the first and second exemplary embodiments is given the same reference numeral, and description thereof is omitted or simplified.

Figure 9:
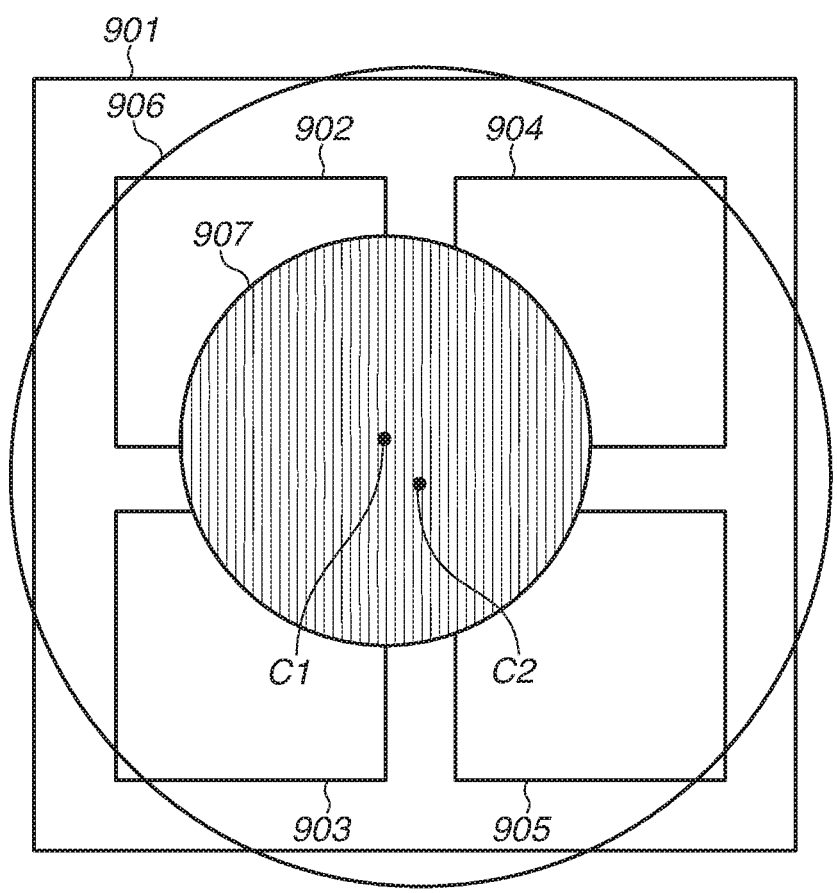
FIG. 9 is a planar view illustrating an exit pupil image and a photoelectric conversion unit of a photoelectric conversion apparatus according to a third exemplary embodiment.
Figure 10:
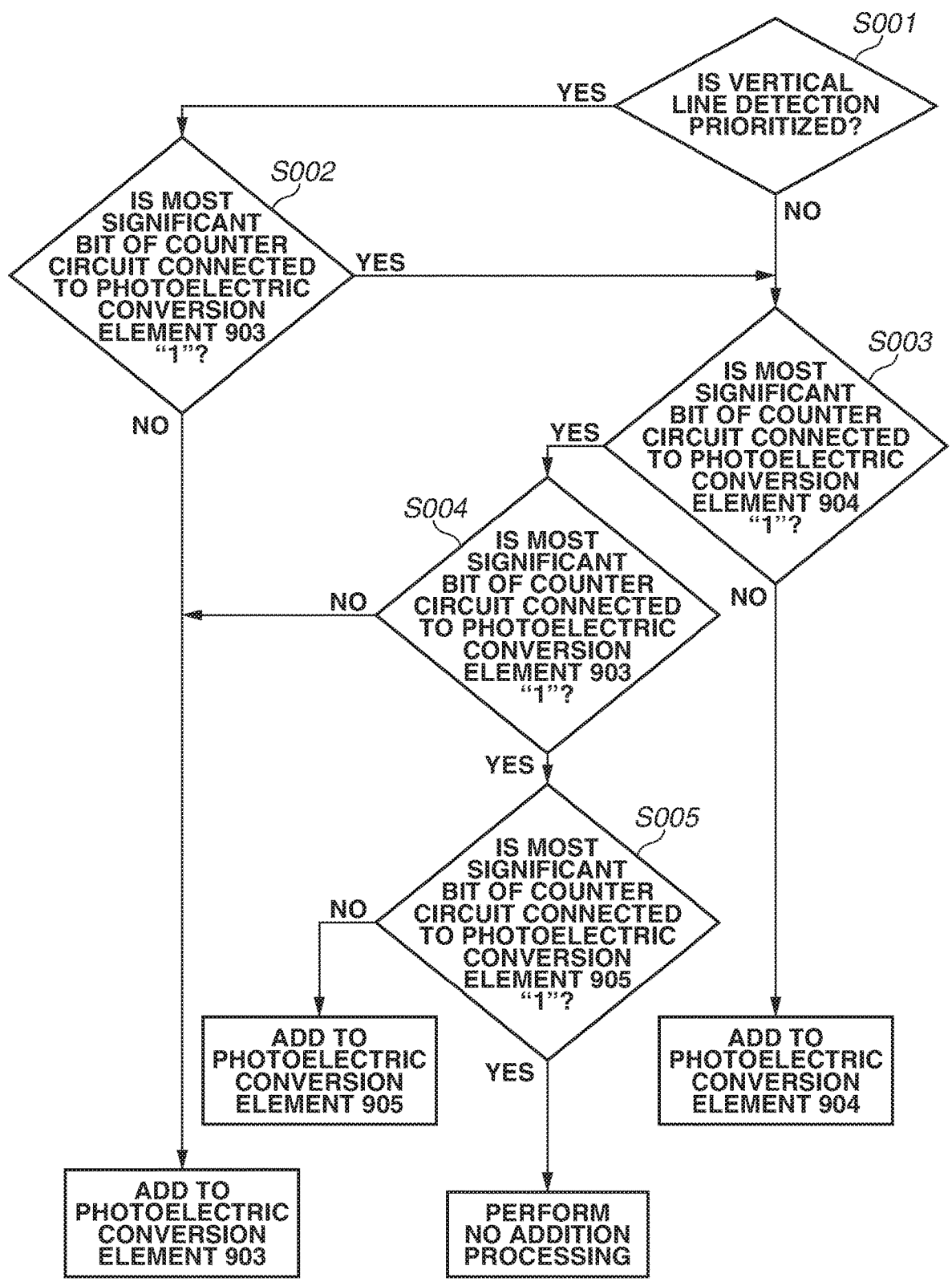
FIG. 10 is a flowchart illustrating a signal processing method to be performed by the photoelectric conversion apparatus according to the third exemplary embodiment.

In the present exemplary embodiment, as illustrated in FIG. 9, one photoelectric conversion unit 901 includes four photoelectric conversion elements 902, 903, 904, and 905. The photoelectric conversion elements 902 to 904 have a similar configuration to that of the photoelectric conversion element 101.

While a vertical line detection autofocusing (AF) is performed using a lateral phase difference in the first and second exemplary embodiments, since the four photoelectric conversion elements 902, 903, 904, and 905 are provided, horizontal line detection AF using a longitudinal phase difference becomes also executable, so that so-called cross AF becomes executable.

A micro-lens 906 is provided so that light is incident on each of the four photoelectric conversion elements 902, 903, 904, and 905 of the photoelectric conversion unit 901. In FIG. 9, an exit pupil image 907 is illustrated. As in FIG. 6, the exit pupil image 907 does not overlap the photoelectric conversion elements 902, 903, 904, and 905 partially, and the center C1 of the exit pupil image 907 is shifted from the center C2, so that there is a difference in light quantity among the four photoelectric conversion elements 902, 903, 904, and 905.

In a case of adding signals from three or more photoelectric conversion elements as in FIG. 9, the photoelectric conversion elements to add the signals is desirably selectable. FIG. 10 is a flowchart illustrating an example of a method of selecting a target to which an additional signal is added by a counter signal from the photoelectric conversion element 902.

First, in step S001, whether the vertical line detection is prioritized or the horizontal line detection is prioritized is judged. Whether the vertical line detection is prioritized or the horizontal line detection is prioritized can be judged based on a direction in which a subject has a high contrast, or the user can select whether the vertical line detection is prioritized or the horizontal line detection is prioritized. At this time, it is desirable to set the vertical line detection prioritized as a default value, because in general many subjects are vertically long due to the effect of the gravity, and the contrast is high in the lateral direction.

If the vertical line detection is prioritized (YES in step S001), the processing proceeds to step S002. When the vertical line detection is prioritized, the pupil division in the lateral direction is prioritized, so that the target to which the signal is to be added is desirably located in the longitudinal direction. Thus, in step S002, if the most significant bit of the counter circuit connected to the photoelectric conversion element 903 is "0" (NO in step S002), the additional signal of the photoelectric conversion element 902 is added to the photoelectric conversion element 903.

Next, a case where the horizontal line detection is prioritized in step S001 and a case where the most significant bit of the counter circuit connected to the photoelectric conversion element 903 is "1" in step S002 will be described. In this case (YES in step S002), the processing proceeds to step S003. In step S003, if the most significant bit of the counter circuit connected to the photoelectric conversion element 904 is "0" (NO in step S003), the count value acquired based on the photoelectric conversion element 902 after the threshold value is exceeded is added to the count value acquired based on the photoelectric conversion element 904.

In step S003, if the most significant bit of the counter circuit connected to the photoelectric conversion element 904 is "1" (YES in step S003), the processing proceeds to step S004.

In step S004, if the most significant bit of the counter circuit connected to the photoelectric conversion element 903 is "1" (YES in step S004), the processing proceeds to step S005. On the other hand, in step S004, if the most significant bit of the counter circuit connected to the photoelectric conversion element 903 is "0" (NO in step S004), the count value acquired based on the photoelectric conversion element 902 after the threshold value is exceeded is added to the count value acquired based on the photoelectric conversion element 903.

In step S005, if the most significant bit of the counter circuit connected to the photoelectric conversion element 905 is "0" (NO in step S005), the count value acquired based on the photoelectric conversion element 902 after the threshold value is exceeded is added to the count value acquired based on the photoelectric conversion element 905. On the other hand, in step S005, if the most significant bit of the counter circuit connected to the photoelectric conversion element 905 is "1" (YES in step S005), addition processing is not performed.

The addition target is selected based on the above-described principle even in a case where a count value acquired based on a photoelectric conversion element other than the photoelectric conversion element 902 reaches the threshold value first or in a case where the threshold value is reached as a result of adding the count value.

In this way, the linearity of the combined input/output characteristic is improved without significantly impairing the function of cross AF even in a case where three or more photoelectric conversion elements are provided to one photoelectric conversion unit.

An photoelectric conversion apparatus and a signal processing method according to a fourth exemplary embodiment will be described below with reference to FIGS. 4 and 11. Each component similar to that in the photoelectric conversion apparatus and the signal processing method according to the first to third exemplary embodiments is given the same reference numeral, and description thereof is omitted or simplified.

Figure 8:
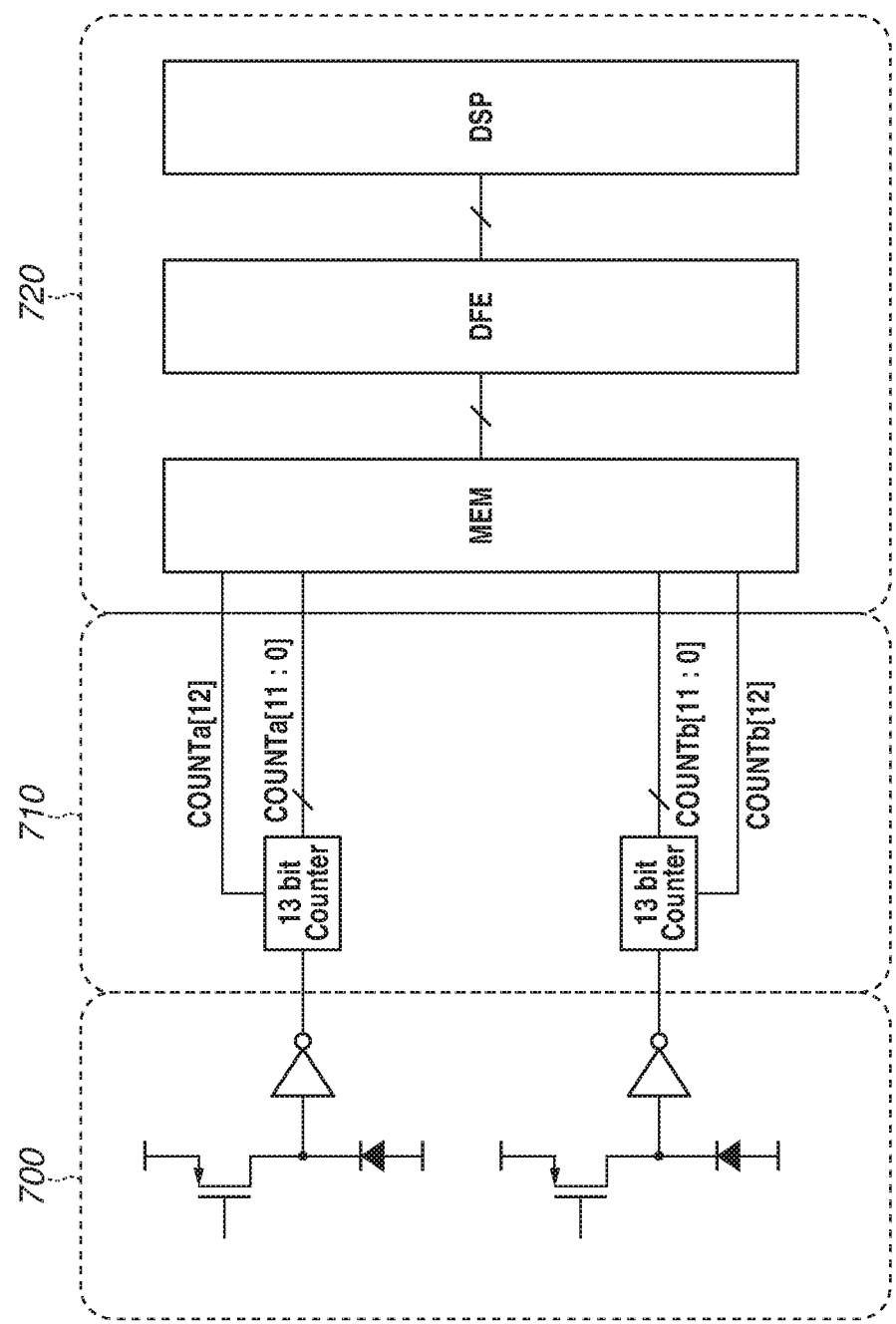
FIG. 8 is a block diagram schematically illustrating a circuit including a photoelectric conversion unit of a photoelectric conversion apparatus according to a second exemplary embodiment.
Figure 11:
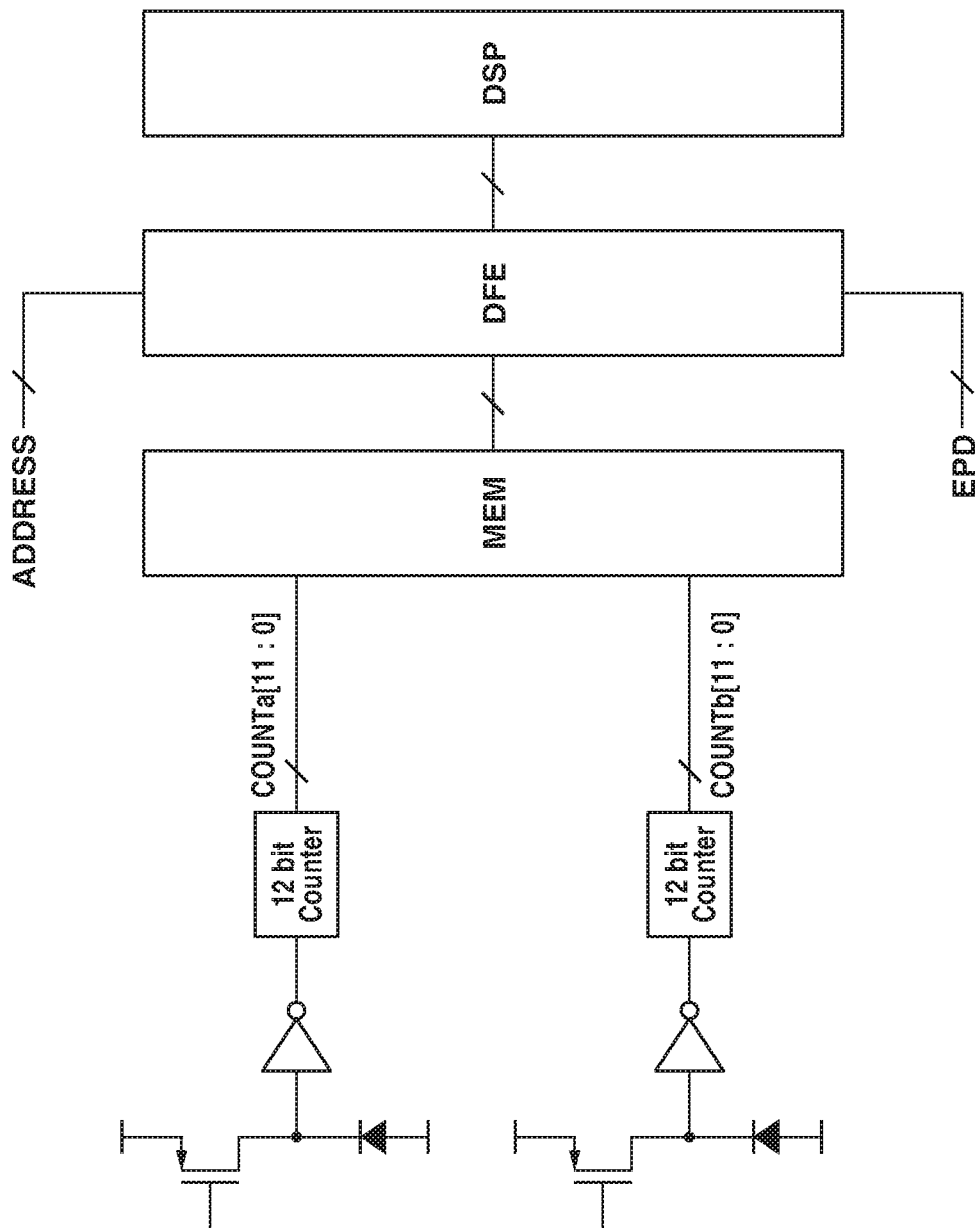
FIG. 11 is a block diagram schematically illustrating a circuit including a photoelectric conversion unit of a photoelectric conversion apparatus according to a fourth exemplary embodiment.

FIG. 11 is different from FIG. 8 that illustrates the second exemplary embodiment in that the COUNT[12] signal is not output from the counter circuits. Meanwhile, distance information EPD about the distance of the photoelectric conversion apparatus 1105 from the exit pupil and an address signal ADDRESS of the photoelectric conversion unit are input to the digital front end DFE block. As described above, the light quantity relationship between the plurality of photoelectric conversion elements provided in the same photoelectric conversion unit is determined by the center of the exit pupil image. Factors that cause the center of the exit pupil image 303 to change include the exit pupil distance 302 of the imaging lens and the horizontal image height 304.

In the case of performing cross AF as in the third exemplary embodiment, information about the vertical image height is also necessary.

As illustrated in FIG. 11, distance information EPD about the distance of the photoelectric conversion apparatus 1105 from the exit pupil and the address signal ADDRESS of the photoelectric conversion unit are input to the digital front end DFE, so that an expected value of the light quantity relationship between the plurality of photoelectric conversion elements provided in the same photoelectric conversion unit is calculated. Meanwhile, if the count value of the 12-bit counter in FIG. 11 reaches 12 bits, the second cycle of counting operation is started, and the light quantity relationship is deviated from the expected value. The fourth exemplary embodiment is characterized in that the deviation from the expected value is detected and a 12-bit signal is output in the digital front end DFE. In the fourth exemplary embodiment, an adder is included in the digital front end DFE. The subsequent additional signal addition processing is similar to that in the first to third exemplary embodiments. Further, in principle, as the image height increases, the difference in light quantity between the photoelectric conversion elements increases. Using this principle, a 12-bit signal may be output in a case where the light quantity relationship of the difference in light quantity is inverted. In this case, the distance information EPD and the ADDRESS signal are not necessarily needed. While the example in which the processing is performed by the digital front end DFE, block is described in the present exemplary embodiment, similar processing can be performed by the digital signal processor DSP block. In this way, the number of bits of the counter is reduced, and the linearity of the combined input/output characteristic 603 is improved without extending the bus width of the subsequent-stage circuit. Further, such advantages are obtained that the bit depth of the memory MEM is reduced, the bit rate of the output interface from the digital front end DFE is reduced, and the processing load on the digital signal processor DSP is reduced.

Figure 12A:
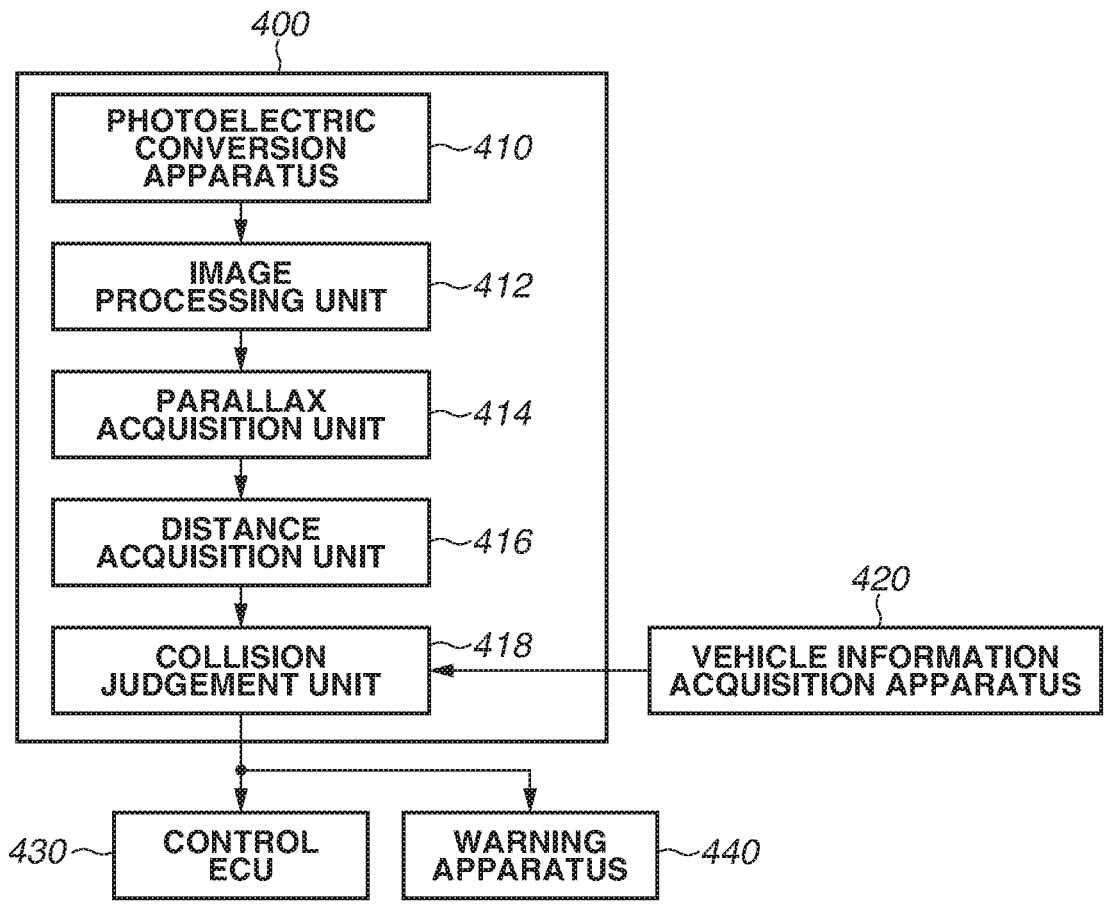
FIGS. 12A and 12B are block diagrams illustrating a configuration of a photoelectric conversion system and a moving object according to a fifth exemplary embodiment.
Figure 12B:
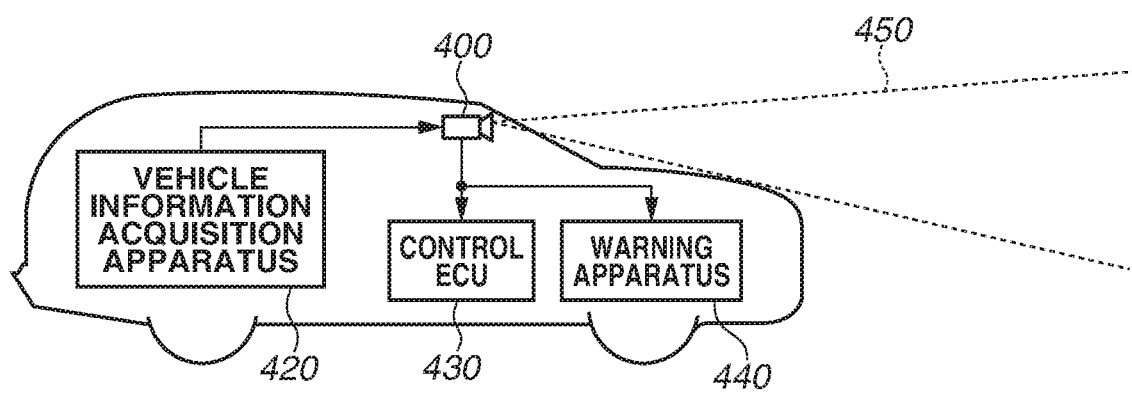

An photoelectric conversion system and a moving object according to a fifth exemplary embodiment will be described below with reference to FIGS. 12A and 12B. FIGS. 12A and 12B illustrate a configuration of each of the photoelectric conversion system and the moving object according to the present exemplary embodiment.

FIG. 12A illustrates an example of a photoelectric conversion system 400 of an in-vehicle camera. The photoelectric conversion system 400 includes a photoelectric conversion apparatus 410. The photoelectric conversion apparatus 410 is one of the photoelectric conversion apparatuses according to the first to fourth exemplary embodiments. The photoelectric conversion system 400 includes an image processing unit 412, which is a processing apparatus configured to perform image processing on a plurality of pieces of image data acquired by the photoelectric conversion apparatus 410. Further, the photoelectric conversion system 400 includes a parallax acquisition unit 414, which is a processing apparatus configured to calculate a parallax (phase difference of parallax image) from the plurality of pieces of image data acquired from the photoelectric conversion apparatus 410. Further, the photoelectric conversion system 400 includes a distance acquisition unit 416 and a collision judgement unit 418. The distance acquisition unit 416 is a processing apparatus configured to calculate the distance to the target based on the calculated parallax. The collision judgement unit 418 is a processing apparatus configured to judge whether there is a possibility of collision based on the calculated distance. The parallax acquisition unit 414 and the distance acquisition unit 416 are an example of an information acquisition unit configured to acquire information such as the distance information about the distance to the target. In addition, the distance information is information about the parallax, the amount of defocus, and the distance to the target. The collision judgement unit 418 may judge whether there is a possibility of collision using any of the distance information. The various processing apparatuses described above may be implemented by dedicated hardware or general-purpose hardware configured to perform calculation based on a software module. Further, the processing apparatuses may be implemented by a field programmable gate array (FPGA) or an application-specific integrated circuit (ASIC).

The photoelectric conversion system 400 is connected to a vehicle information acquisition apparatus 420 and is capable of acquiring vehicle information such as the vehicle speed, yaw rate, and steering angle. Further, the photoelectric conversion system 400 is connected to a control ECU 430, which is a control apparatus configured to output a control signal for generating braking force with respect to the vehicle based on the result of the judgement by the collision judgement unit 418. In other words, the control ECU 430 is an example of a moving object control unit configured to control a moving object based on the distance information. Further, the photoelectric conversion system 400 is also connected to a warning apparatus 440 configured to provide a warning to the driver based on the result of the judgement by the collision judgement unit 418. For example, in a case where the collision judgement unit 418 judges that there is a high possibility of collision, the control ECU 430 performs vehicle control to avoid collision or reduce damage by braking, releasing the accelerator, or reducing the engine output. The warning apparatus 440 provides a warning to the user by providing a sound warning, displaying warning information on a screen of a car navigation system, or shaking a seatbelt or steering.

In the present exemplary embodiment, the photoelectric conversion system 400 captures images around the vehicle, e.g., front or rear. FIG. 12B illustrates the photoelectric conversion system 400 in the case of capturing an image of the front (image capturing range 450) of the vehicle. The vehicle information acquisition apparatus 420 transmits an instruction to operate the photoelectric conversion system 400 and execute photoelectric conversion. The photoelectric conversion apparatus according to the first to fourth exemplary embodiments is used as the photoelectric conversion apparatus 410 so that the photoelectric conversion system 400 according to the present exemplary embodiment can further improve the ranging accuracy.

While the example in which the control is performed so as to avoid collision with another vehicle is described above, the present exemplary embodiment is also applicable to the control to drive automatically following another vehicle and control to drive automatically while keeping within a lane. Further, the photoelectric conversion system is applicable to not only a vehicle such as a car but also a moving object (transportation device) such as a ship, airplane, or industrial robot. A moving apparatus of the moving object (transportation device) is various moving units such as an engine, motor, wheel, or propeller. The present exemplary embodiment is also applicable not only to the moving object but also to a device that widely uses object recognition, such as an intelligent transport system (ITS).

The exemplary embodiments make it possible to maintain the linearity of an input/output characteristic of a photoelectric conversion apparatus.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2018-146715, filed Aug. 3, 2018, which is hereby incorporated by reference herein in its entirety.

What is claimed is:
1. A photoelectric conversion apparatus comprising:
a first photoelectric conversion element;
a second photoelectric conversion element;
a first counter configured to perform a counting operation to change a count value based on a signal input from the first photoelectric conversion element;
a second counter configured to perform a counting operation to change a count value based on a signal input from the second photoelectric conversion element;
a first reset circuit configured to reset the first photoelectric conversion element based on an amount of charge generated at the first photoelectric conversion element;
a second reset circuit configured to reset the second photoelectric conversion element based on an amount of charge generated at the second photoelectric conversion element;
an adder to which the count value of the first counter and the count value of the second counter are input; and
a detection circuit configured to detect an event that the count value of the first counter exceeds a threshold value.

2. The photoelectric conversion apparatus according to claim 1,
wherein the first counter continues the counting operation, after the count value of the first counter exceeds the threshold value, and
wherein the count value of the first counter that is acquired through the counting operation performed after the count value of the first counter exceeds the threshold value is input to the adder.

3. The photoelectric conversion apparatus according to claim 1, further comprising a second detection circuit configured to detect an event that the count value of the second counter exceeds a second threshold value,
wherein the second counter continues the counting operation, after the count value of the second counter exceeds the second threshold value and
wherein the count value of the second counter that is acquired through the counting operation performed after the count value of the second counter exceeds the threshold value is input to the adder.

4. The photoelectric conversion apparatus according to claim 1, further comprising a first output circuit and a second output circuit,
wherein the first output circuit outputs the count value of the first counter or a predetermined count value depending on whether the detection circuit detects the event that the count value of the first counter exceeds the threshold value, and
wherein the second output circuit outputs the count value of the second counter or another value depending on whether the detection circuit detects the event that the count value of the first counter exceeds the threshold value.

5. The photoelectric conversion apparatus according to claim 4, further comprising a third detection circuit configured to detect an event that a count value of the adder exceeds a third threshold value.

6. The photoelectric conversion apparatus according to claim 5, wherein the second output circuit selects and outputs the count value of the adder or the predetermined value as the other value depending on whether the third detection circuit detects the event that the third threshold value is exceeded.

7. The photoelectric conversion apparatus according to claim 6, wherein a number of bits of the first output circuit is less than a number of bits of the first counter.

8. The photoelectric conversion apparatus according to claim 7, wherein a number of output lines through which the count value of the first counter is transmitted is less than a number of output lines through which the count value of the first output circuit is transmitted.

9. The photoelectric conversion apparatus according to claim 1,
wherein the first counter is of n (n is an integer not less than two) bits, and
wherein the threshold value is a value at which a less significant bit than a most significant bit among the n bits is inverted.

10. The photoelectric conversion apparatus according to claim 9, wherein the detection circuit is an output line configured to transmit a signal of the most significant bit among the n bits.

11. The photoelectric conversion apparatus according to claim 1, wherein each of the first photoelectric conversion element and the second photoelectric conversion element is a single photon avalanche diode.

12. The photoelectric conversion apparatus according to claim 1,
wherein the first photoelectric conversion element and the second photoelectric conversion element are provided with a first substrate,
wherein the first counter, the second counter, and the adder are provided with a second substrate, and
wherein the first substrate and the second substrate are stacked.

13. The photoelectric conversion apparatus according to claim 3, further comprising:
a third photoelectric conversion element;
a third counter configured to perform a counting operation to change a count value based on incidence of light on the third photoelectric conversion element; and
a fourth detection circuit configured to detect an event that a count value of the third counter exceeds a third threshold value,
wherein the count value to be input to the adder is selected from among the count value output from the first counter, the count value output from the second counter, and the count value output from the third counter depending on whether the detection circuit detects an event that the threshold value is exceeded, whether the second detection circuit detects an event that the second threshold value is exceeded, and whether the fourth detection circuit detects an event that the third threshold value is exceeded.

14. The photoelectric conversion apparatus according to claim 1, wherein a single micro-lens is provided so as to overlap the first photoelectric conversion element and the second photoelectric conversion element in planar view.

15. A photoelectric conversion system comprising:
the photoelectric conversion apparatus according to claim 1; and
a processing apparatus configured to process a signal output from the photoelectric conversion apparatus.

16. A moving object comprising:
the photoelectric conversion apparatus according to claim 1;
a moving apparatus;
a processing apparatus configured to acquire information from a signal output from the photoelectric conversion apparatus; and
a control apparatus configured to control the moving apparatus based on the information.

17. A signal processing circuit comprising:
a first counter;
a second counter;
an adder to which a count value of the first counter and a count value of the second counter are input; and
a detection circuit configured to detect an event that the count value of the first counter exceeds a threshold value,
wherein the first counter resets the count value and then continues a counting operation, after the count value of the first counter exceeds the threshold value, and
wherein the count value of the first counter after the resetting is input to the adder.

18. The signal processing circuit according to claim 17,
wherein the first counter is of n (n is an integer not less than two) bits, and
wherein the threshold value is a value at which a less significant bit than a most significant bit among the n bits is inverted.

19. The signal processing circuit according to claim 18, wherein the detection circuit is an output line configured to transmit a signal of the most significant bit among the n bits.

* * * * *